(12) United States Patent
Horiguchi

(10) Patent No.: US 6,828,629 B2
(45) Date of Patent: Dec. 7, 2004

(54) SEMICONDUCTOR DEVICE AND METHOD OF FABRICATING THE SAME

(75) Inventor: Naoto Horiguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/768,064

(22) Filed: Feb. 2, 2004

(65) Prior Publication Data

US 2004/0169222 A1 Sep. 2, 2004

(30) Foreign Application Priority Data

Feb. 28, 2003 (JP) ........................................ 2003-053330

(51) Int. Cl.$^7$ .............................................. H01L 29/76
(52) U.S. Cl. ...................... 257/336; 257/344; 257/338; 257/488; 438/302; 438/303; 438/304; 438/305; 438/306
(58) Field of Search .............................. 257/336, 344, 257/338, 488; 438/302–306

(56) References Cited

U.S. PATENT DOCUMENTS 6,383,881 B1 * 5/2002 Akram et al. ............... 438/303

OTHER PUBLICATIONS

Patent Abstracts of Japan, Publication No. 05267331, dated Oct. 15, 1993.
Patent Abstracts of Japan, Publication No. 06224381, dated Aug. 12, 1994.
Patent Abstracts of Japan, Publication No. 06338591, dated Dec. 6, 1994.
Patent Abstracts of Japan, Publication No. 11163157, dated Jun. 18, 1999.
Patent Abstracts of Japan, Publication No. 2000196077, dated Jul. 14, 2000.

* cited by examiner

*Primary Examiner*—Fetsum Abraham
(74) *Attorney, Agent, or Firm*—Westerman, Hattori, Daniels & Adrian, LLP

(57) ABSTRACT

A P-type pocket layer is formed in the surficial portion of a semiconductor substrate, a sidewall insulating film having a thickness of as thin as 10 nm or around is formed, and P is implanted therethrough to thereby form an N-type extension layer in the surficial portion of the p-type pocket layer. Then, a sidewall insulating film is formed, and P is implanted to thereby form an N-type source and a drain diffusion layer. P, having a larger coefficient of diffusion than that of conventionally-used As, used in the formation of the pocket layer can successfully moderate a strong electric field in the vicinity of the channel, and can consequently reduce leakage current between the drain and the semiconductor substrate and thereby reduce the off-leakage current, even if the gate length is reduced to 100 nm or shorter.

18 Claims, 27 Drawing Sheets

SEMICONDUCTOR DEVICE AND METHOD OF FABRICATING THE SAME

CROSS-REFERENCE TO RELATED APPLICATIONS

This application is based upon and claims the benefit of priority from the prior Japanese Patent Application No. 2003-053330, filed on Feb. 28, 2003, the entire contents of which are incorporated herein by reference.

BACKGROUND OF THE INVENTION

1. Field of the Invention

The present invention relates to a semiconductor device successfully reduced in the off-leakage current, and a method of fabricating the semiconductor device.

2. Description of the Related Art

Recent demands for downsizing of chips have accelerated shortening of gate length of MOS transistors. Short-gate-length MOS transistors are used for battery-powered electronic appliances such as cellular phones, for which a small off-leakage current is an essential feature, and have extension layers and pocket layers formed therein by using As, having a small coefficient of diffusion, as an N-type impurity. More specifically, As is used as an N-type impurity in the pocket layers of P-channel (PMOS) transistor, and extension layers of N-channel (NMOS) transistors. For the purpose of suppressing short-channel effect, and in particular of suppressing generation of off-leakage current and lowering in threshold voltage, which are possibly accompanying the shortening of the gate length, one known conventional method is to raise impurity concentration in the channel.

In this method applied to fabrication of an NMOS transistor, first as shown in FIG. 22A, a gate insulating film 102 and a gate electrode 103 are formed on a semiconductor substrate 101 having a P-type well already formed therein. Next, as shown in FIG. 22B, boron (B) ions are implanted to the semiconductor substrate 101 to thereby form in the surficial portion thereof a P-type pocket layer 104. The ions are implanted by oblique ion implantation which is effected from four directions normal to one another in a plan view, at an implantation energy of 5 to 10 keV, and a dose per direction of $3 \times 10^{12}$ to $1.8 \times 10^{13}$ cm$^{-2}$. Next, as shown in FIG. 22C, arsenic (As) ions are implanted to the pocket layer 104 to thereby form in the surficial portion thereof an N-type extension layer 106. The ion implantation at this time is effected from the direction normal to the surface of the semiconductor substrate 101. The implantation energy is set to 2 to 5 keV, and the dose to $5 \times 10^{14}$ to $3 \times 10^{15}$ cm$^{-2}$. Thereafter a deep N-type source-and-drain diffusion layer and so forth are formed, to thereby complete the NMOS transistor.

On the other hand, in this method applied to fabrication of a PMOS transistor, first as shown in FIG. 23A, a gate insulating film 132 and a gate electrode 133 are formed on a semiconductor substrate 131 having an N-type well already formed therein. Next, as shown in FIG. 23B, arsenic (As) ions are implanted in the semiconductor substrate 131 to thereby form in the surficial portion thereof an N-type pocket layer 134. The ions are implanted by oblique ion implantation which is effected from four directions normal to one another in a plan view, at an implantation energy of 40 to 80 keV, and a dose per direction of $3 \times 10^{12}$ to $1.5 \times 10^{13}$ cm$^{-2}$. Next, as shown in FIG. 23C, B ions are implanted to the pocket layer 134 to thereby form in the surficial portion thereof a P-type extension layer 136. The ion implantation at this time is effected from the direction normal to the surface of the semiconductor substrate 131. The implantation energy is set to 0.2 to 0.5 keV, and the dose to $5 \times 10^{14}$ to $2 \times 10^{15}$ cm$^{-2}$. Thereafter a deep P-type source-and-drain diffusion layer and so forth are formed, to thereby complete the PMOS transistor.

Prior arts are disclosed in Japanese Patent Laid-Open Nos. 11-163157, 5-267331, 6-224381, 6-338591 and 2000-196077.

Raising in the impurity concentration in the channel by forming the pocket layer in recent transistors having a gate length reduced to as short as 100 nm or less, however, intensifies the electric field at the PN junction in the vicinity of the extension layer, and increases band-to-band tunnel leakage between the drain and the body. The tunnel leakage undesirably increases the off-leakage current.

The present invention is conceived considering the above-described problems, and objects thereof reside in providing a semiconductor device capable of fully suppressing the off-leakage current even if the gate length is as short as 100 nm or less, and in providing a method of fabricating the semiconductor device.

SUMMARY OF THE INVENTION

After thorough investigations for solving the above-described subjects, the present inventors reached several embodiments described in the next.

A first semiconductor device according to the present invention comprises: a semiconductor substrate; a gate insulating film and a gate electrode formed on the semiconductor substrate: a pair of first sidewall insulating films formed on the lateral portions of the gate electrode; and a pair of second sidewall insulating films formed so as to sandwich the first sidewall insulating films with the gate electrode, and having a width larger than that of the first sidewall insulating films. In the surficial portion of the semiconductor substrate, a pair of first N-type impurity-diffused layers containing phosphorus are formed at a first depth so as to be self-aligned with respect to the gate electrode and the first sidewall insulating films. In the surficial portion of the semiconductor substrate, a pair of second N-type impurity-diffused layers are formed at a second depth deeper than the first depth so as to be self-aligned with respect to the gate electrode, the first sidewall insulating films and the second sidewall insulating films. Between the pair of second N-type impurity-diffused layers, a pair of P-type impurity-diffused layers are formed so as to respectively be in adjacent to each of the pair of first N-type impurity-diffused layers.

A second semiconductor device according to the present invention comprises: a semiconductor substrate; a gate insulating film and a gate electrode formed on the semiconductor substrate; and a pair of sidewall insulating films formed on the lateral portions of the gate electrode. In the surficial portion of the semiconductor substrate, a pair of first P-type impurity-diffused layers are formed at a first depth so as to be self-aligned with respect to the gate electrode. In the surficial portion of the semiconductor substrate, a pair of second P-type impurity-diffused layers are formed at a second depth deeper than the first depth so as to be self-aligned with respect to the gate electrode and the sidewall insulating films. Between the pair of second P-type impurity-diffused layers, a pair of N-type impurity-diffused layers containing phosphorus are formed so as to respectively be in adjacent to each of the pair of first P-type impurity-diffused layers.

In a first method of fabricating a semiconductor device of the present invention, first, a gate insulating film and a gate electrode are formed on a semiconductor substrate. Next, a pair of P-type impurity-diffused layers are formed by introducing a P-type impurity into the surficial portion of the semiconductor substrate with using the gate electrode as a mask, and a pair of first sidewall insulating films are formed on the lateral portions of the gate electrode. Here, the pair of first sidewall insulating films may be formed before the pair of P-type impurity-diffused layers are formed. Next, a pair of first N-type impurity-diffused layers are formed at a first depth by introducing at least phosphorus into the surficial portion of the semiconductor substrate with using the gate electrode and the first sidewall insulating films as a mask. Next, a pair of second sidewall insulating films are formed so as to sandwich the first sidewall insulating films with the gate electrode, and so as to have a width larger than that of the first sidewall insulating films. Next a pair of second N-type impurity-diffused layers are formed at a second depth deeper than the first depth by introducing an N-type impurity into the surficial portion of the semiconductor substrate with using the gate electrode, the first sidewall insulating films and the second sidewall insulating films as a mask.

In a second method of fabricating a semiconductor device according to the present invention, first, a gate insulating film and a gate electrode are formed on a semiconductor substrate. Next, a pair of N-type impurity-diffused layers are formed by introducing at least phosphorus into the surficial portion of the semiconductor substrate with using the gate electrode as a mask. Next, a pair of first P-type impurity-diffused layers are formed at a first depth by introducing a P-type impurity into the surficial portion of the semiconductor substrate with using the gate electrode as a mask. Next, a pair of sidewall insulating films are formed on the lateral portions of the gate electrode. Next, a pair of second P-type impurity-diffused layers are formed at a second depth deeper than the first depth by introducing a P-type impurity into the surficial portion of the semiconductor substrate with using the gate electrode and the sidewall insulating films as a mask.

The present invention can successfully moderate a strong electric field in the vicinity of the channel, and can consequently reduce leakage current between the drain and the semiconductor substrate even if the gate length is 100 nm or shorter, and can thereby reduce the off-leakage current.

DETAILED DESCRIPTION OF THE PREFERRED EMBODIMENTS

The next paragraphs will specifically describe preferred embodiments of the present invention referring to the attached drawings.

(Basic Principle of the Invention)

First the basic principle of the present invention will be explained.

Off-leakage current of MOS transistor varies with impurity concentration in its channel (channel dose or pocket dose). In the conventional MOS transistors, a larger channel impurity concentration resulted in a smaller off-leakage current, so that a method of raising the channel impurity concentration has conventionally been adopted in order to suppress the short-channel effect. It has, however, been known as described in the above that the off-leakage current could not be reduced beyond a specific value even if the channel impurity concentration was increased when the gate length was extremely shortened, particularly to as short as 100 nm or below.

Figure 1:
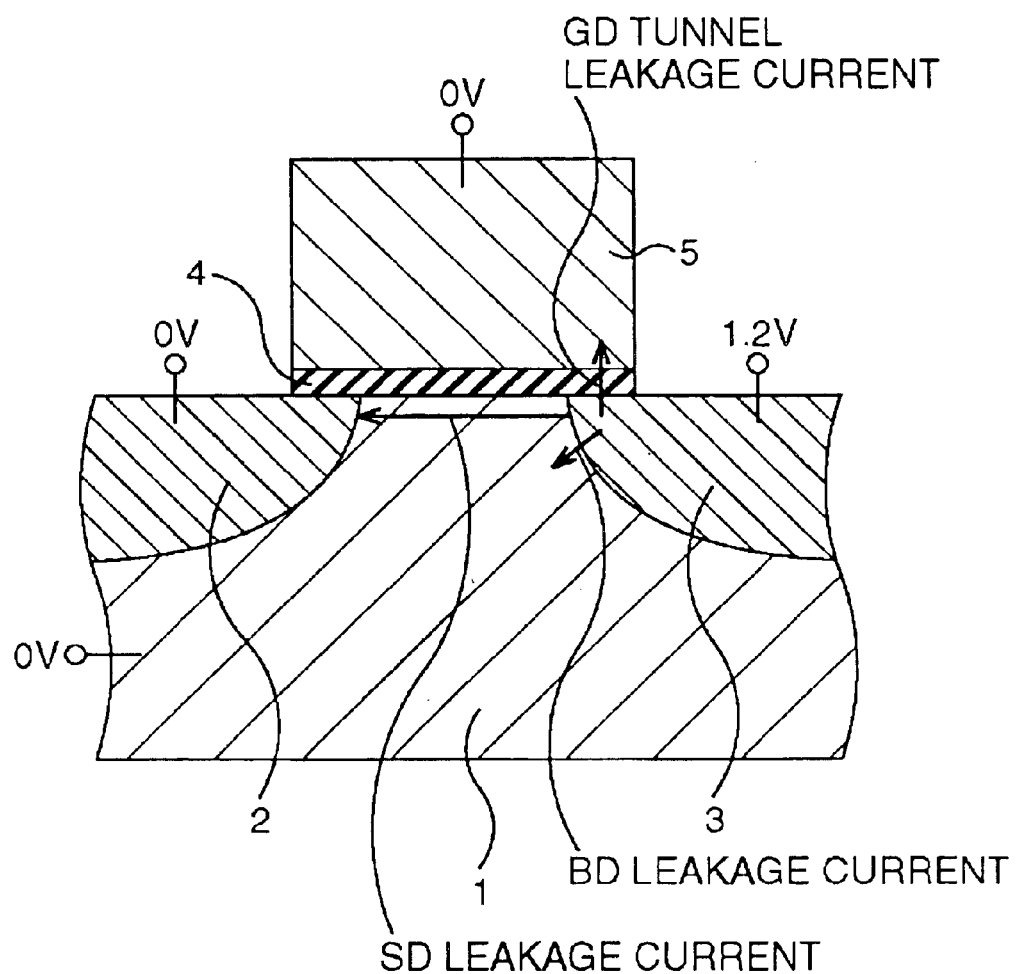
FIG. 1 is a sectional view for explaining types of off-leakage current in an NMOS transistor.

Our extensive researches aimed at finding out causes for this problem revealed the following facts. FIG. 1 is a sectional view for explaining types of off-leakage current in an NMOS transistor.

In an exemplary case of OFF status of the NMOS transistor, gate electrode 5 formed on a semiconductor substrate 1 while placing a gate insulating film 4 in between is applied with 0 V, a source region 2 formed in the surficial portion of the semiconductor substrate 1 again with 0 V, the semiconductor substrate 1 again with 0 V, and a drain region 3 formed in the surficial portion of the semiconductor substrate 1 with 1.2 V.

In this status, a source-drain (SD) leakage current flows between the source region 2 and the drain region 3, a gate-drain (GD) tunnel leakage current flows between the gate electrode 5 and the drain region 3, and a body-drain (BD) leakage current flows between the semiconductor substrate 1 and the drain region 3. The off-leakage current is a total of these leakage components.

Figure 2:
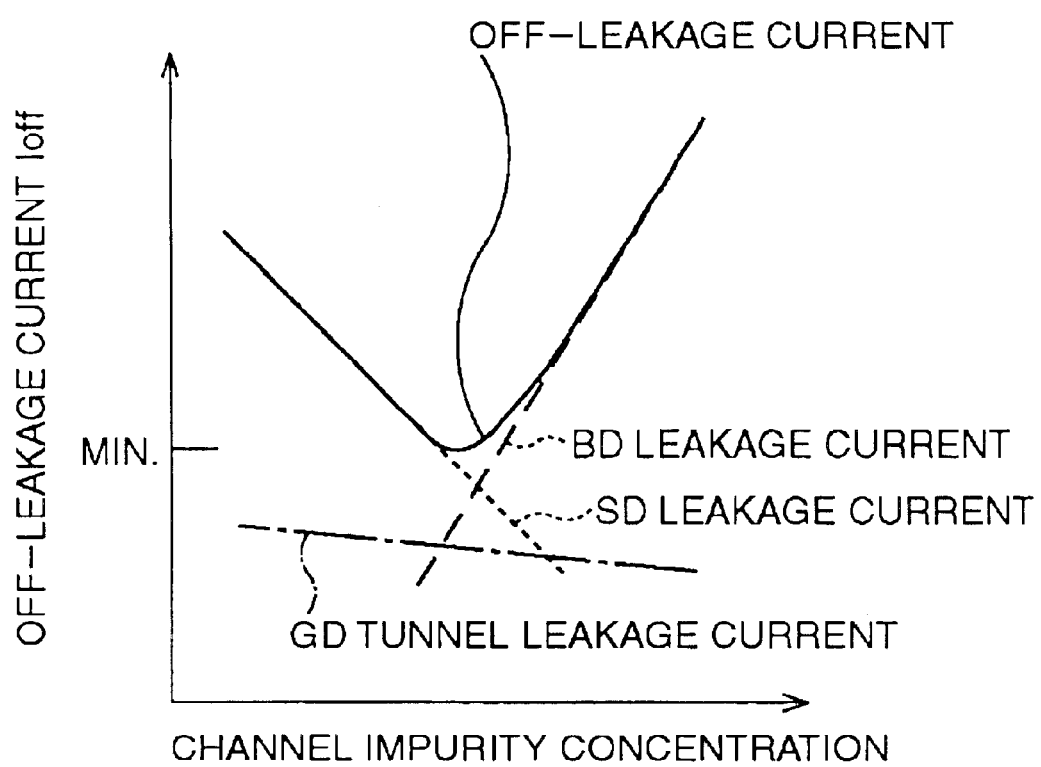
FIG. 2 is a graph showing a relation between the channel impurity concentration and off-leakage current in a PMOS transistor.

A relation between the channel impurity concentration and off-leakage current in a PMOS transistor is shown in FIG. 2. Under a gate length such as being owned by the conventional MOS transistors, a certain level of channel impurity concentration was enough to suppress the off-leakage current to a permissible level. In this range, as shown in FIG. 2, the SD leakage current has an extremely large contribution whereas the BD leakage current has only an extremely small contribution, so that raising of the channel impurity concentration readily resulted in a lowered SD leakage current, and consequently in a suppressed off-leakage current.

Although it has been considered that a larger channel impurity concentration is necessary for shortening the gate length, a larger channel impurity concentration undesirably increases contribution of the BD leakage current, and raises the off-leakage current against expectation. That is, as indicated by a solid line in FIG. 2, the off-leakage current has a minimum value.

This indicates that it is no more possible to reduce the off-leakage current only simply by raising the channel impurity concentration, which has been a conventional practice, for MOS transistors having a gate length of as short as 100 nm or less.

The present inventor carried out extensive investigations into reduction in the electric field in the vicinity of the channel, and conceived that the BD leakage current in the PMOS transistor can be suppressed by intentionally using P, which has a large coefficient of diffusion, for formation of the pocket layer, and that in the NMOS transistor can be suppressed by using P for formation of the extension layer.

Figure 3:
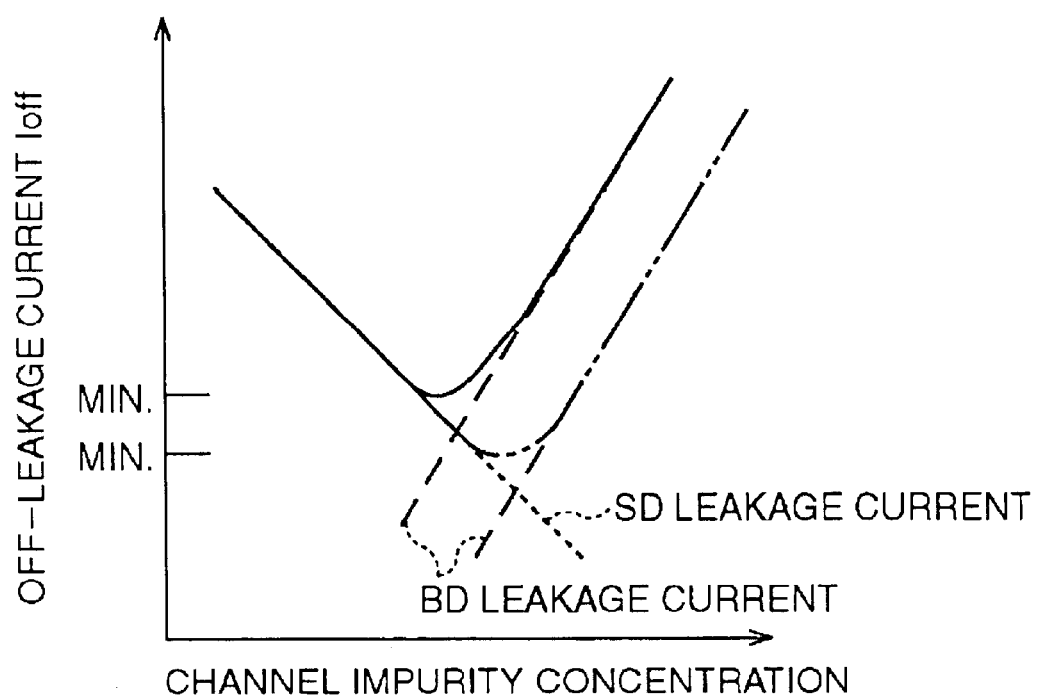
FIG. 3 is a graph showing relations between channel impurity concentration and off-leakage current, as compared between an As pocket and a P pocket.

FIG. 3 is a graph showing relations between channel impurity concentration and off-leakage current, as compared between an As pocket and a P pocket. As shown in FIG. 3, in the PMOS transistor, the BD leakage current becomes lower for the case where the P pocket is used (two-dot chain line), rather than for the case where the As pocket is used (solid line), and consequently the minimum value of the off-leakage current decreases to a corresponding degree. This means that the off-leakage current can be reduced by raising the channel impurity, concentration. Also for the NMOS transistor, similar effect can be expected by using P extension layer in place of the conventional As extension layer.

(Effects in N-Channel MOS Transistor)

Figure 4:
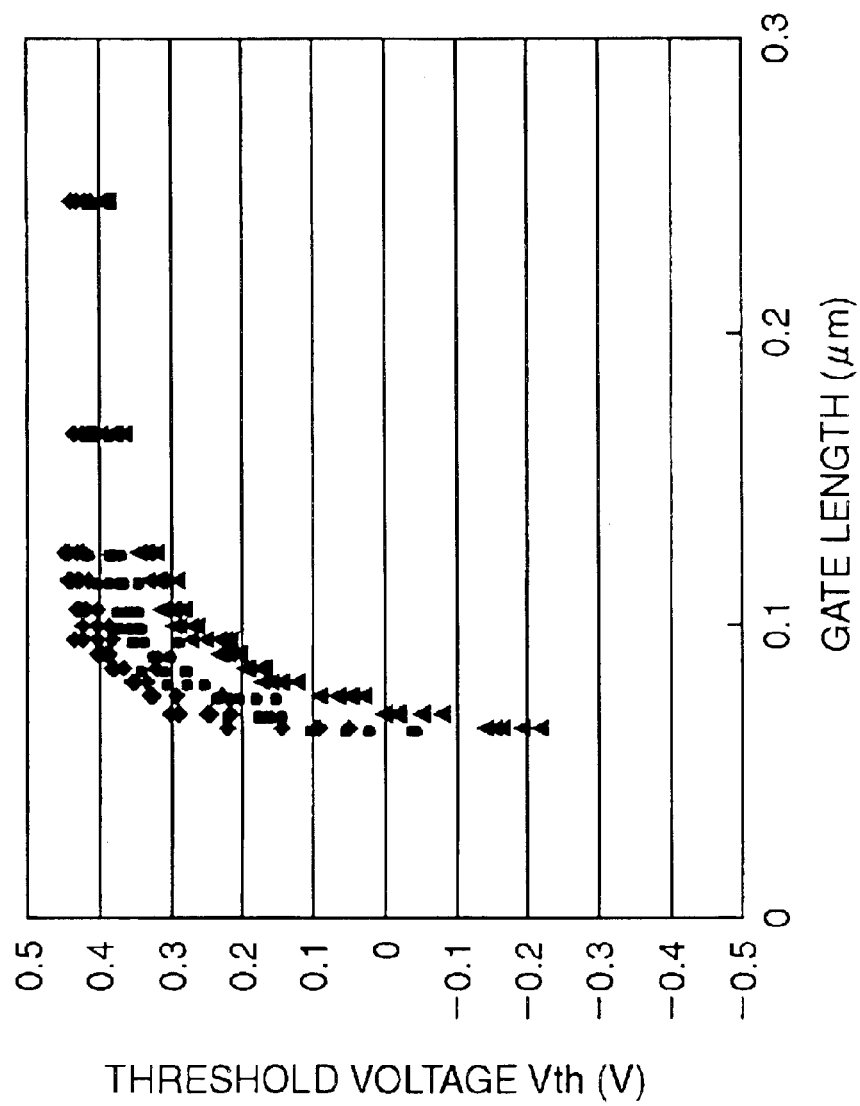
FIG. 4 is a graph showing relations of gate length and threshold voltage $V_{th}$ of an NMOS transistor having an As extension layer.

Next, effects in the P extension layer in the NMOS transistor will be explained. FIG. 4 is a graph showing relations of gate length and threshold voltage $V_{th}$ of the NMOS transistor having the As extension layer. FIG. 4 shows results of the measurement of the NMOS transistor fabricated by using B for forming the pocket layer, As for forming the extension layer, and P for forming the source and the drain. In FIG. 4, plots ▲, ● and ♦ differ from one another in dose for the pocket layer, where doses represented by plots ● and ♦ are 1.5 times and 2 times as large as dose represented by plot ▲, respectively.

As shown in FIG. 4, the gate length longer than 115 nm (0.115 μm) or around resulted in a relatively small variation in the threshold voltage $V_{th}$ with changes in the gate length, irrespective of the dose. The gate length shorter than 100 nm (0.1 μm), however, resulted in a larger variation (roll-off) in the threshold voltage with changes in the gate length, and in a more distinct short-channel effect.

Figure 5:
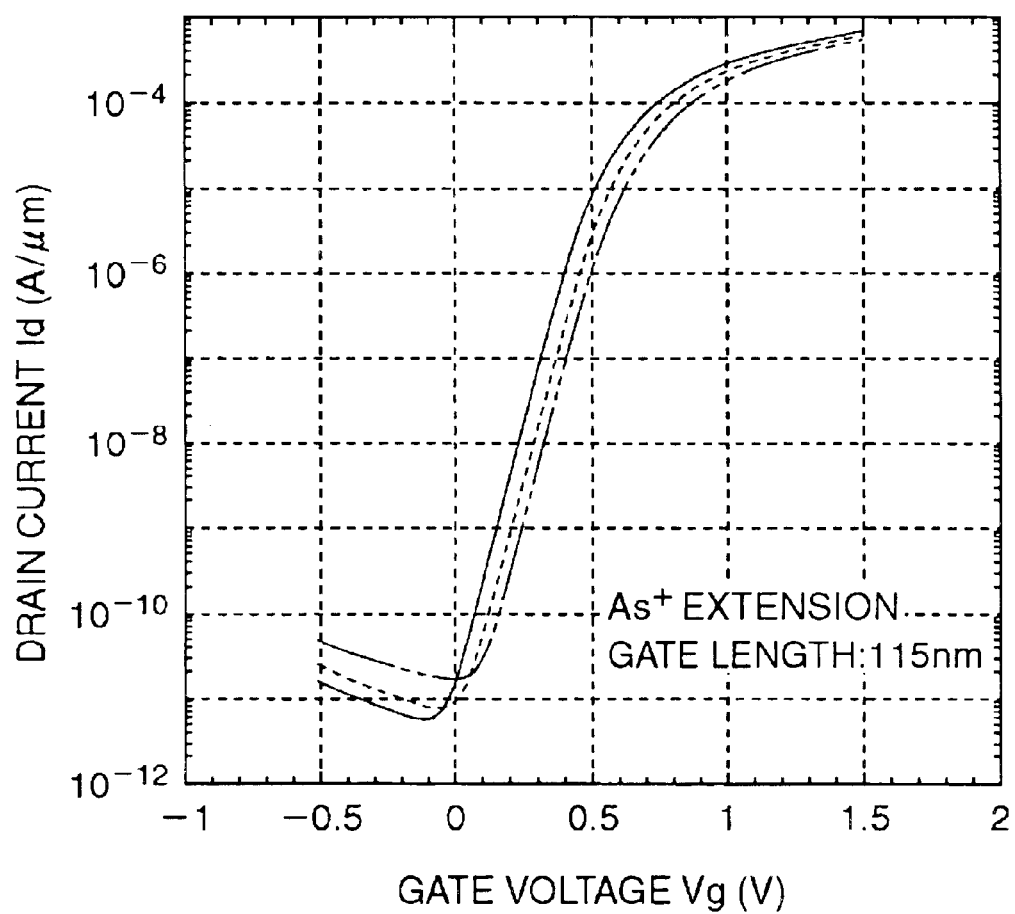
FIG. 5 is a graph showing relations between gate voltage and drain current obtained in the presence of an As extension layer and a 115-nm long gate.
Figure 6:
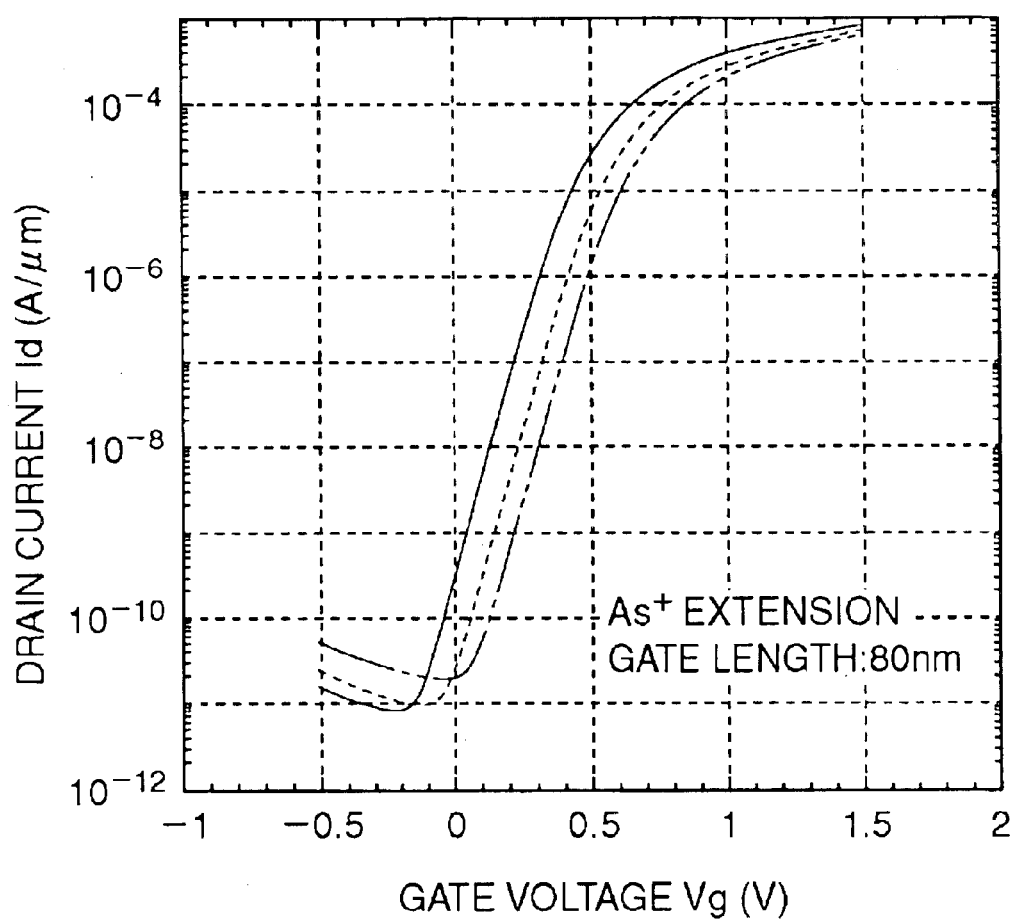
FIG. 6 is a graph showing relations between gate voltage and drain current obtained in the presence of an As extension layer and a 80-nm long gate.

For the case where the As extension layer was used, it was also found that a gate length of 115 nm resulted in a drain current $I_d$ (off-leakage current) of $10^{-11}$ (A/μm) or around at a gate voltage $V_g$ of 0 V, even under a low dose of the pocket layer as shown in FIG. 5, whereas a gate length of 80 nm resulted in a large variation in the off-leakage current with dose of the pocket layer which was increased to raise the threshold voltage as shown in FIG. 6. In FIGS. 5 and 6, the solid line, broken line and two-dot chain line indicate results obtained under the same doses as expressed by plots ▲, ● and ♦ in FIG. 4, respectively. The same will apply also to FIGS. 7 and 8.

In short, for the case where the As extension layer was used, as shown in FIGS. 5 and 6, even a dose capable of fully suppressing the off-leakage current under a gate length of 115 nm (solid line) was found to result in increase in the off-leakage current by a single or more orders of magnitude under a gate length of 80 nm, where even 1.5 times as much as the dose (broken line) and twice as much as the dose (two-dot chain line) were unsuccessful in fully suppressing the off-leakage current, showing a technical limit for the reduction in the off-leakage current.

Figure 7:
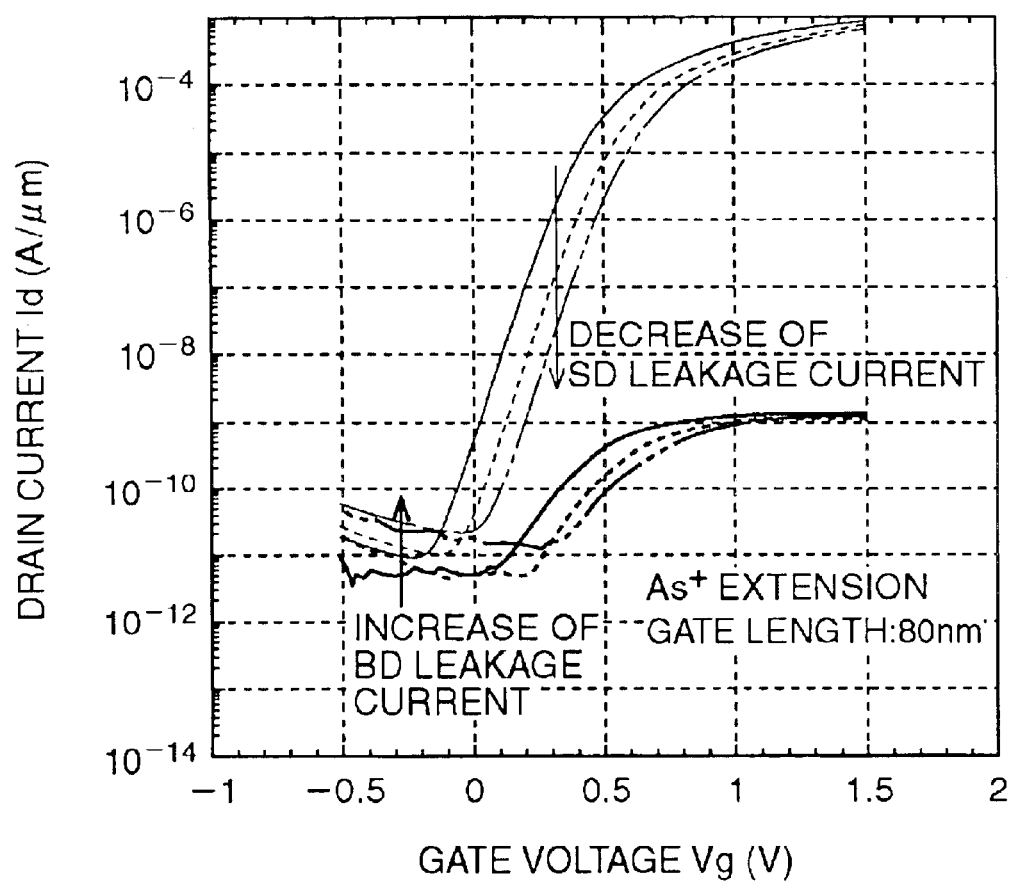
FIG. 7 is a graph showing BD leakage component in the drain current $I_d$ shown in FIG. 6.

FIG. 7 is a graph showing BD leakage component in the drain current $I_d$ shown in FIG. 6. In FIG. 7, the thick lines indicate the BD leakage current, and in more detail, the thick solid line, thick broken line and thick two-dot chain line indicate BD leakage currents expressed by the solid line, broken line and two-dot chain line in FIG. 6, respectively. It was found that the BD leakage current for the case where the As extension layer was used increased as the dose of the pocket layer increased.

Figure 8:
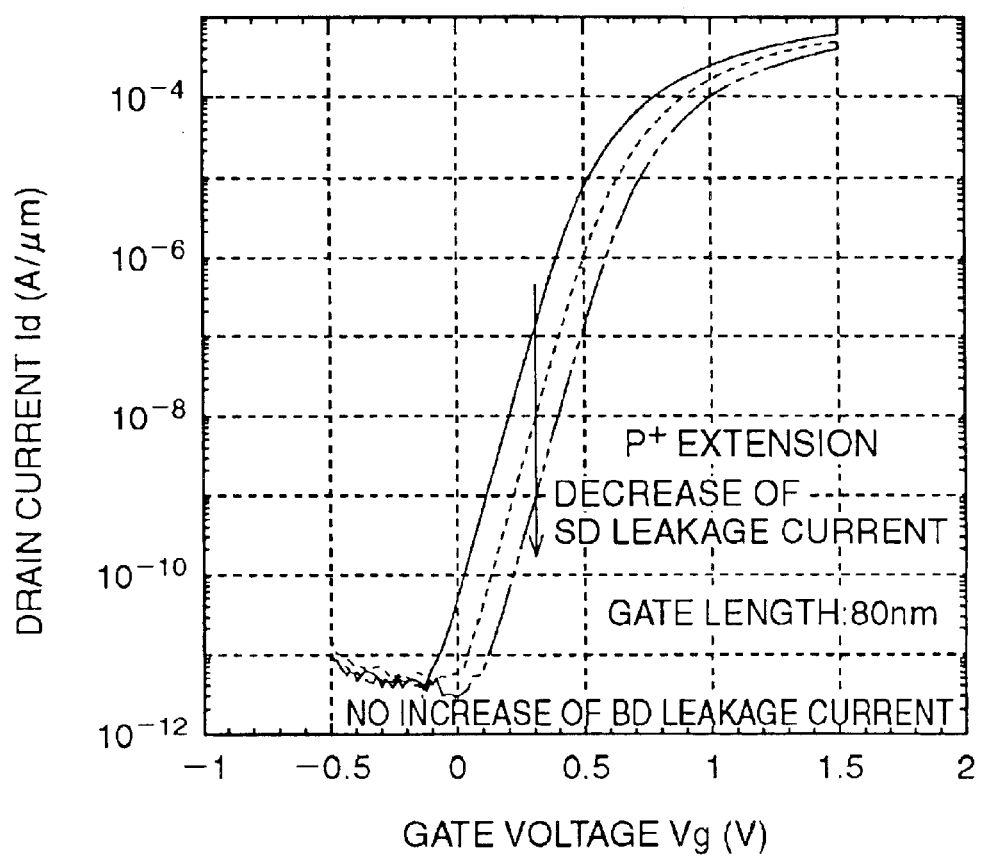
FIG. 8 is a graph showing relations between gate voltage $V_g$ and drain current $I_d$ in an NMOS transistor having a P extension layer.

In contrast to this, use of the P extension layer in place of the As extension layer for the NMOS transistor is successful in suppressing increase in the BD leakage current with increase in the dose of the pocket layer. FIG. 8 is a graph showing relations between gate voltage $V_g$ and drain current $I_d$ in the NMOS transistor having the P extension layer. Results shown in FIG. 8 are obtained under a gate length of 80 nm, similarly to those shown in FIGS. 6 and 7.

As shown in FIG. 8, when the P extension layer was used, the BD leakage current was found to be stabilized at a low value without showing increase. It was concluded that raising of the dose of the pocket layer was successful in suppressing the SD leakage current, and thereby in suppressing the off-leakage current.

Figure 9:
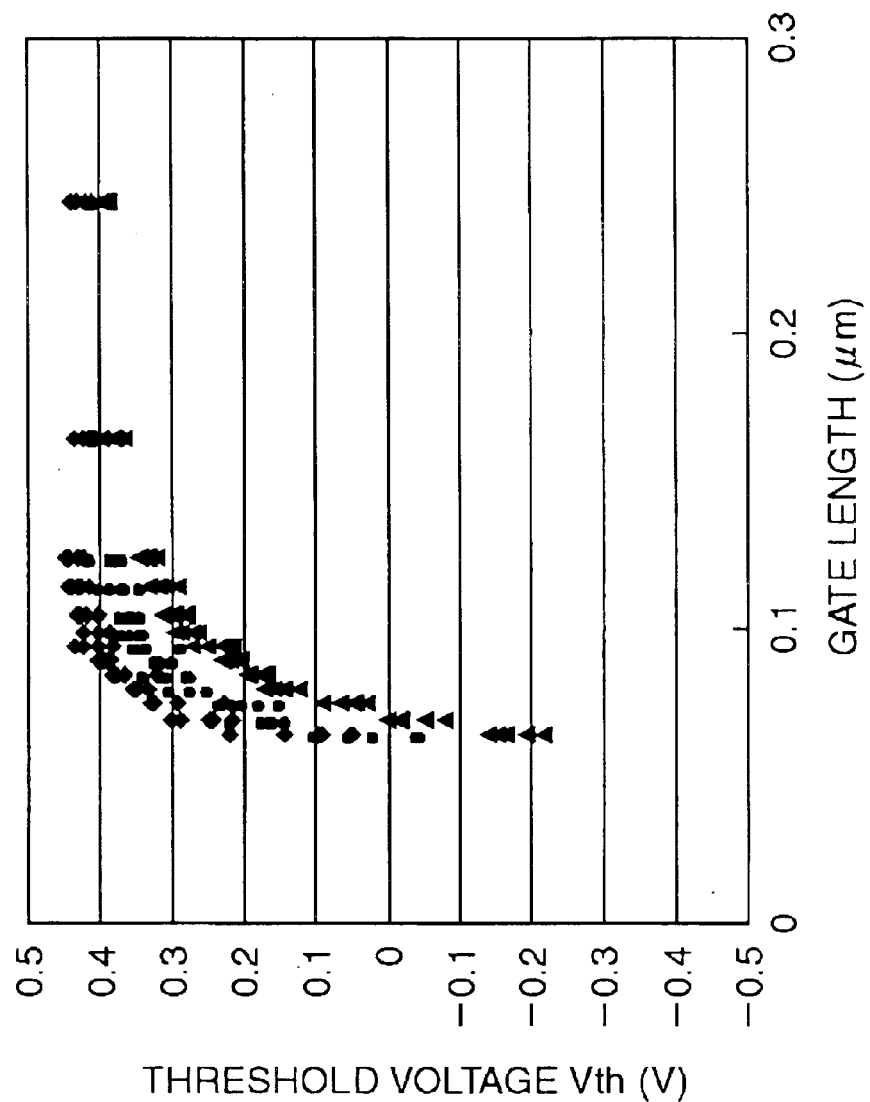
FIG. 9 is a graph showing relations between gate length and threshold voltage $V_{th}$ of an NMOS transistor having a P extension layer.

For reference, FIG. 9 is a graph showing relations between gate length and threshold voltage $V_{th}$ of the NMOS transistor having the P extension layer. Plots ▲, ● and ◆ in FIG. 9 respectively indicate results obtained under the same conditions used under the same symbols in FIG. 4. As is clear from FIG. 9, the roll-off was observed even when the P extension layer was used if the gate length was as short as 80 nm or around. However, even in this range of the gate length, the use of the P extension layer made it possible to reduce the off-leakage current by raising the dose of the pocket layer, that is, channel impurity concentration as shown in FIG. 8.

Figure 10:
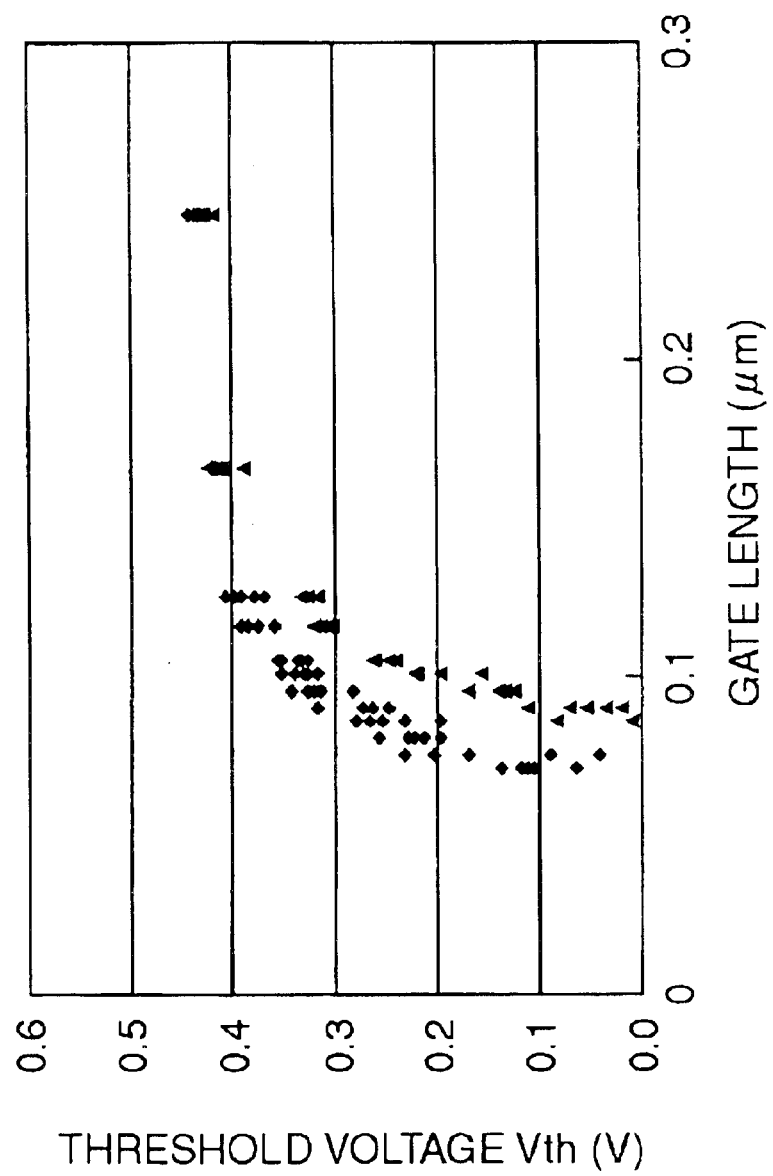
FIG. 10 is a graph showing relations between gate length and threshold voltage $V_{th}$ of an NMOS transistor having a P extension layer, as compared between presence and absence of a thin sidewall.
Figure 11:
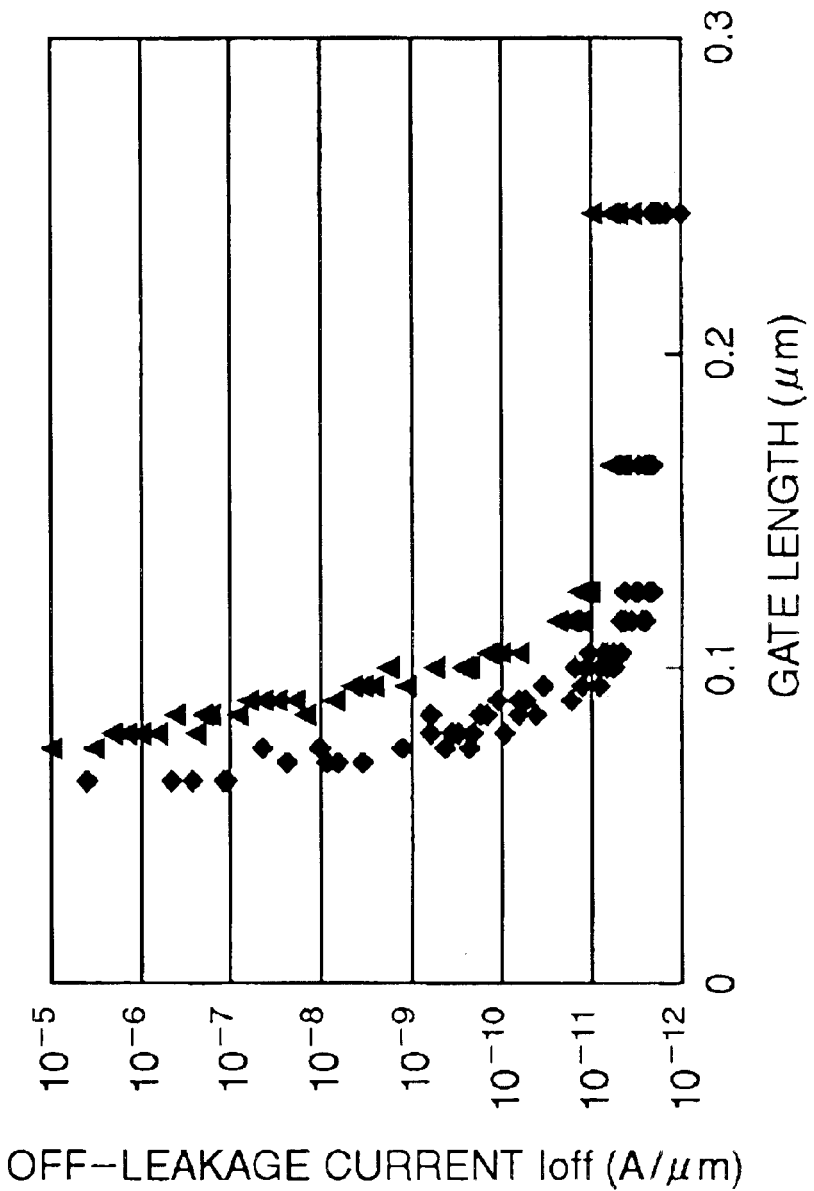
FIG. 11 is a graph showing relations between gate length and off-leakage current $I_{off}$ of an NMOS transistor having a P extension layer, as compared between presence and absence of a thin sidewall.

When the P extension layer is formed, it is necessary to carry out the ion implantation after forming a thin sidewall insulating film on the lateral portions of the gate electrode, rather than forming the P extension layer on both sides of the gate electrode in a self-aligned manner under masking only by such gate electrode. This is because P has a larger coefficient of diffusion than As has. FIG. 10 is a graph showing relations between gate length and threshold voltage $V_{th}$ of the NMOS transistor having the P extension layer, as compared between presence and absence of the thin sidewall, and FIG. 11 is a graph showing relations between gate length and off-leakage current $I_{off}$, as compared between presence and absence of the thin sidewall. Plots ▲ and ◆ in FIGS. 10 and 11 indicate results obtained in the absence and presence of the thin sidewall insulating film, respectively. As is clear from FIGS. 10 and 11, in the absence of the thin sidewall insulating film (▲), the NMOS transistor showed a more distinct roll-off and a large off-leakage current if the gate length is 100 nm or shorter. In an exemplary case with a gate length of 80 nm or around, the presence of the thin sidewall insulating film (◆) resulted in the off-leakage current smaller by a single or more orders of magnitude as compared with the case in the absence of the thin sidewall insulating film (Effects in P-Channel MOS Transistor)

Figure 12:
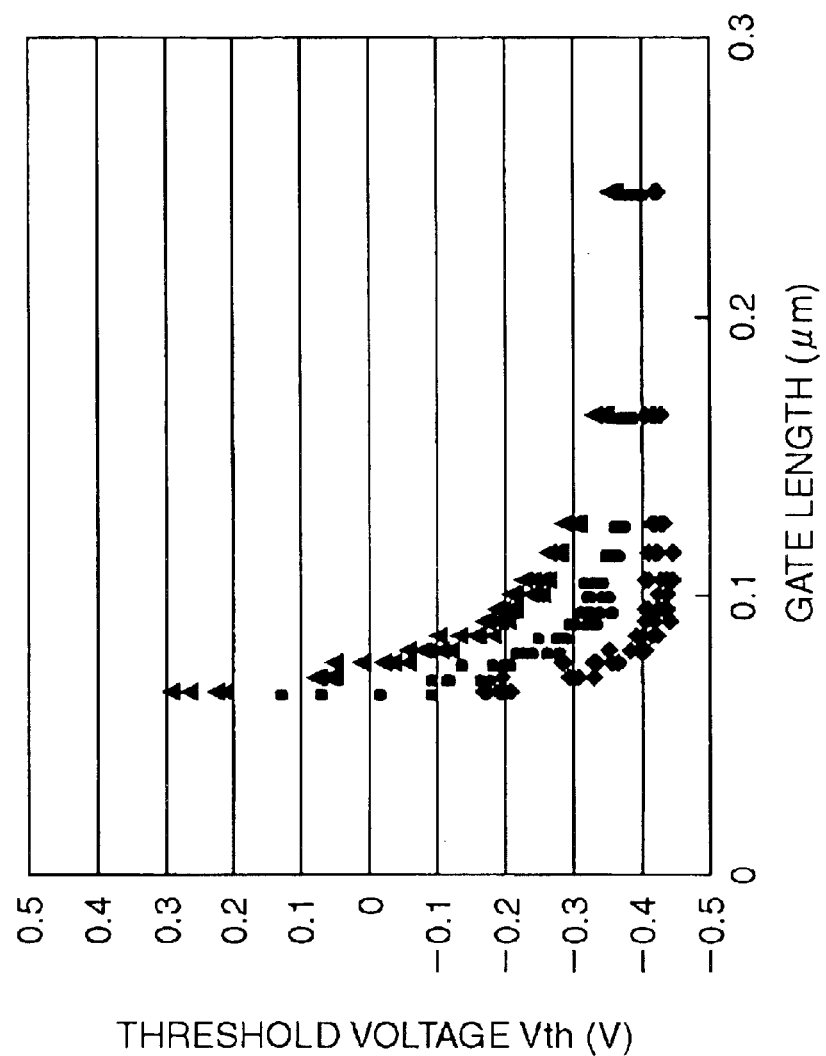
FIG. 12 is a graph showing relations between gate length and threshold voltage $V_{th}$ of an PMOS transistor having an As pocket layer.

Next, effects in the P pocket layer in the PMOS transistor will be explained. FIG. 12 is a graph showing relations of gate length and threshold voltage $V_{th}$ of the PMOS transistor having the As pocket layer. The figure shows results of the measurement of the PMOS transistor fabricated by using As for forming the pocket layer, B for forming the extension layer, and B for forming the source and the drain. In FIG. 12, plots ▲, ● and ◆ differ from each other in dose for the pocket layer, where doses represented by plots ● and ◆ are 2 times and 3 times as large as dose represented by plot ▲, respectively.

As shown in FIG. 12, the gate length longer than 115 nm (0.115 μm) or around resulted in a relatively small variation in the threshold voltage $V_{th}$ with changes in the gate length, irrespective of the dose. The gate length shorter than 100 nm (0.1 μm), however, resulted in a larger variation (roll-off) in the threshold voltage with changes in the gate length, and in a more distinct short-channel effect. These trends are similar to those for the aforementioned NMOS transistor.

Figure 13:
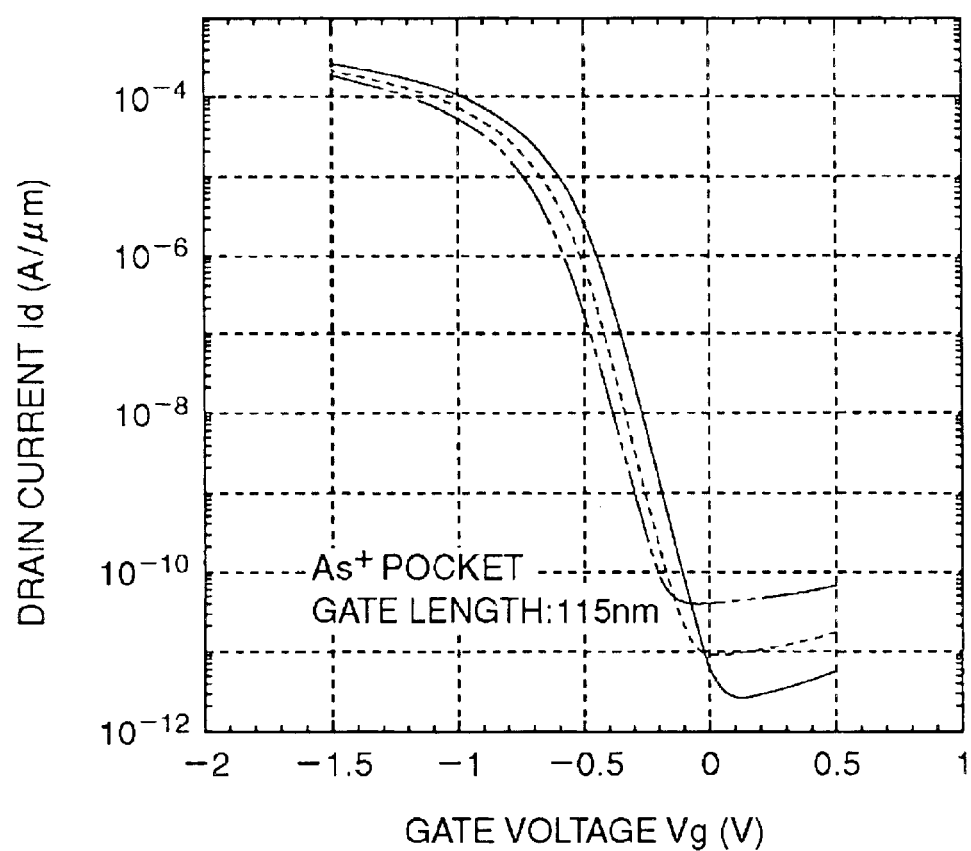
FIG. 13 is a graph showing relations between gate voltage and drain current obtained in the presence of an As pocket layer and a 115-nm long gate.
Figure 14:
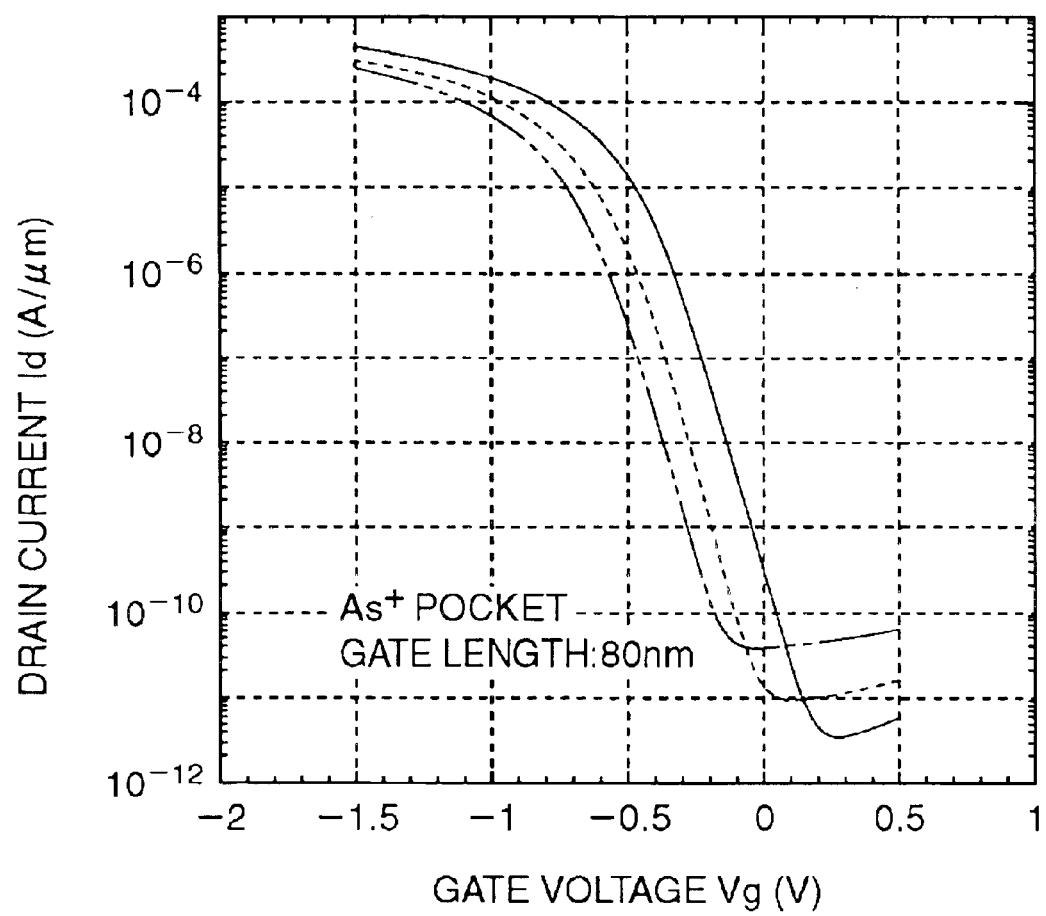
FIG. 14 is a graph showing relations between gate voltage and drain current obtained in the presence of an As pocket layer and a 80-nm long gate.

For the case where the As pocket layer was used, it was also found that a gate length of 115 nm resulted in a drain current $I_d$ (off-leakage current) of $10^{-11}$ (A/μm) or around even under a low dose of the pocket layer as shown in FIG. 13, whereas a gate length of 80 nm resulted in a large variation in the off-leakage current with dose of the pocket layer as shown in FIG. 14. In FIGS. 13 and 14, the solid line, broken line and two-dot chain line indicate results obtained under the same doses as expressed by plots ▲, ● and ◆ in FIG. 12, respectively. The same will apply also to FIGS. 15, 16 and 17 below.

For the case where the As pocket layer was used, as shown in FIG. 14, a gate length of 80 nm successfully resulted in an off-leakage current reduced to a certain extent by raising the dose of the pocket layer, but the off-leakage current could not be reduced even if the dose was further raised, showing a technical limit for the reduction in the off-leakage current.

Figure 15:
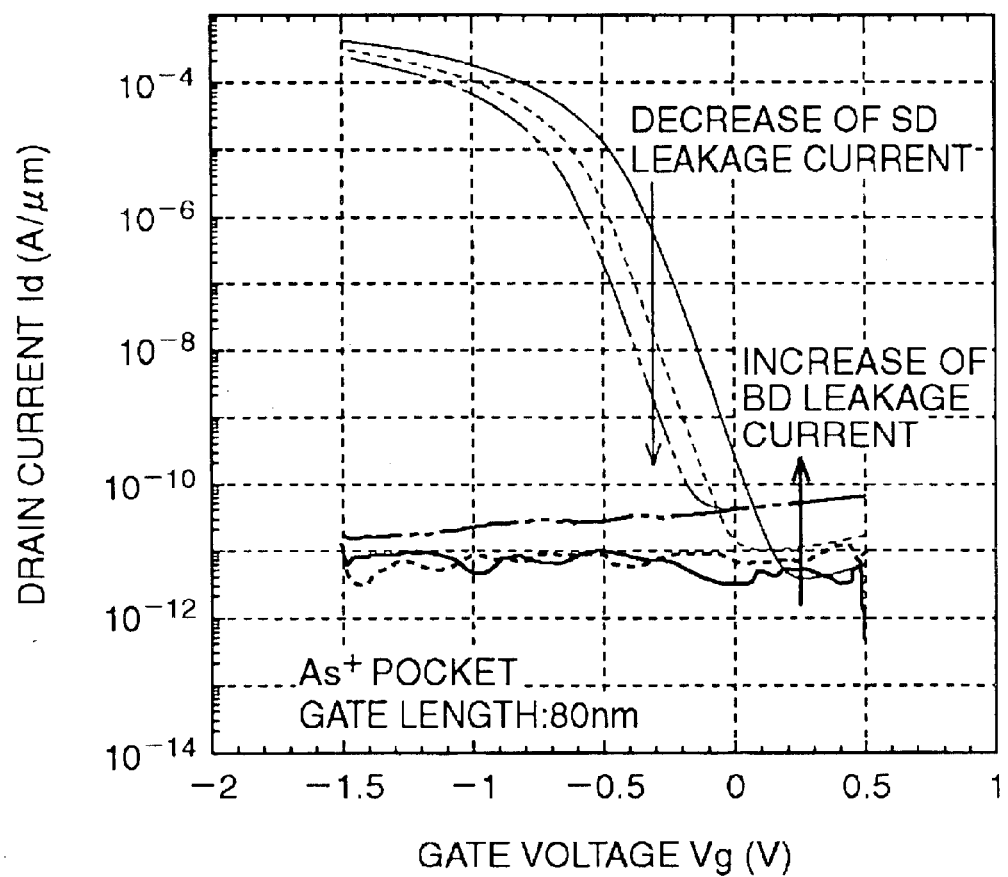
FIG. 15 is a graph showing BD leakage component in the drain current $I_d$ shown in FIG. 14.

FIG. 15 is a graph showing BD leakage component in the drain current $I_d$ shown in FIG. 14. In FIG. 15, the thick lines indicate the BD leakage current, and in more detail, the thick solid line, thick broken line and thick two-dot chain line indicate BD leakage currents expressed by the solid line, broken line and two-dot chain line in FIG. 14, respectively. It was found that the BD leakage current for the case where the As pocket layer was used increased as the dose of the pocket layer increased.

Figure 16:
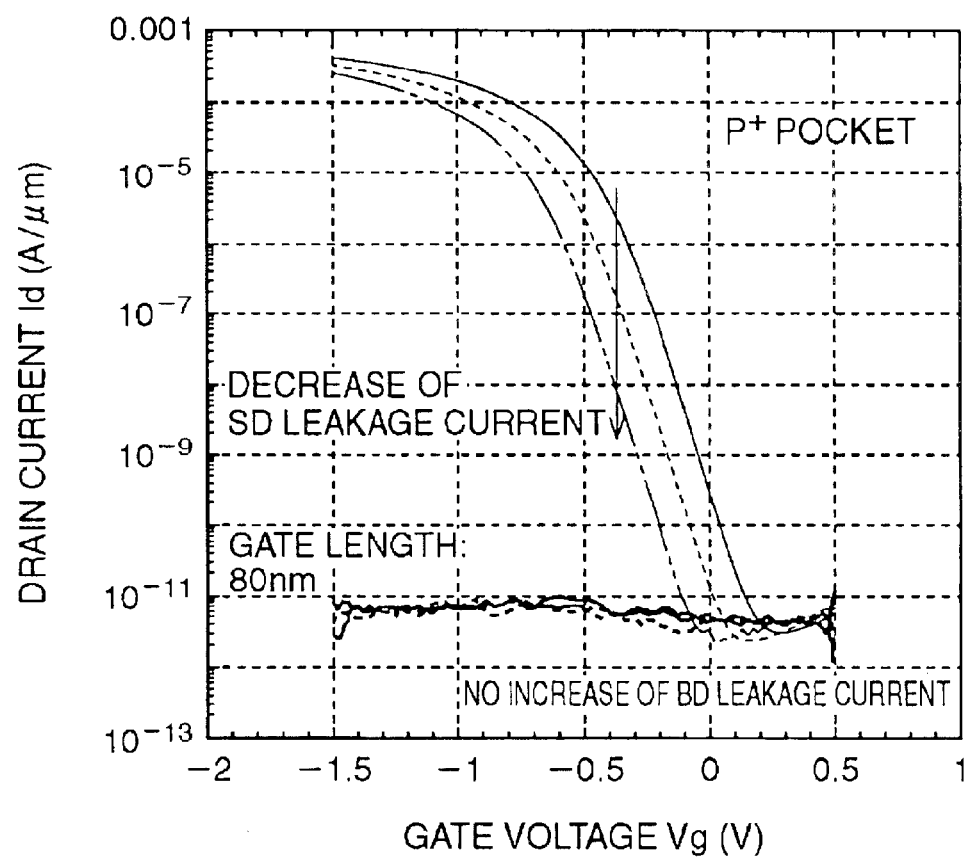
FIG. 16 is a graph showing relations of gate voltage $V_g$ and drain current $I_d$ of a PMOS transistor (gate length: 80 nm) having a P pocket layer.

In contrast to this, use of the P pocket layer in place of the As pocket layer for the PMOS transistor is successful in suppressing increase in the BD leakage current with increase in the dose of the pocket layer. FIG. 16 is a graph showing relations between gate voltage $V_g$ and drain current $I_d$ in the PMOS transistor having the P pocket layer. Results shown in FIG. 16 are obtained under a gate length of 80 nm, similarly to those shown in FIGS. 14 and 15.

As shown in FIG. 16, when the P pocket layer was used, the BD leakage current was found to be stabilized at a low value without showing increase. It was concluded that raising of the dose of the pocket layer was successful in suppressing the SD leakage current, and thereby in suppressing the off-leakage current.

Figure 17:
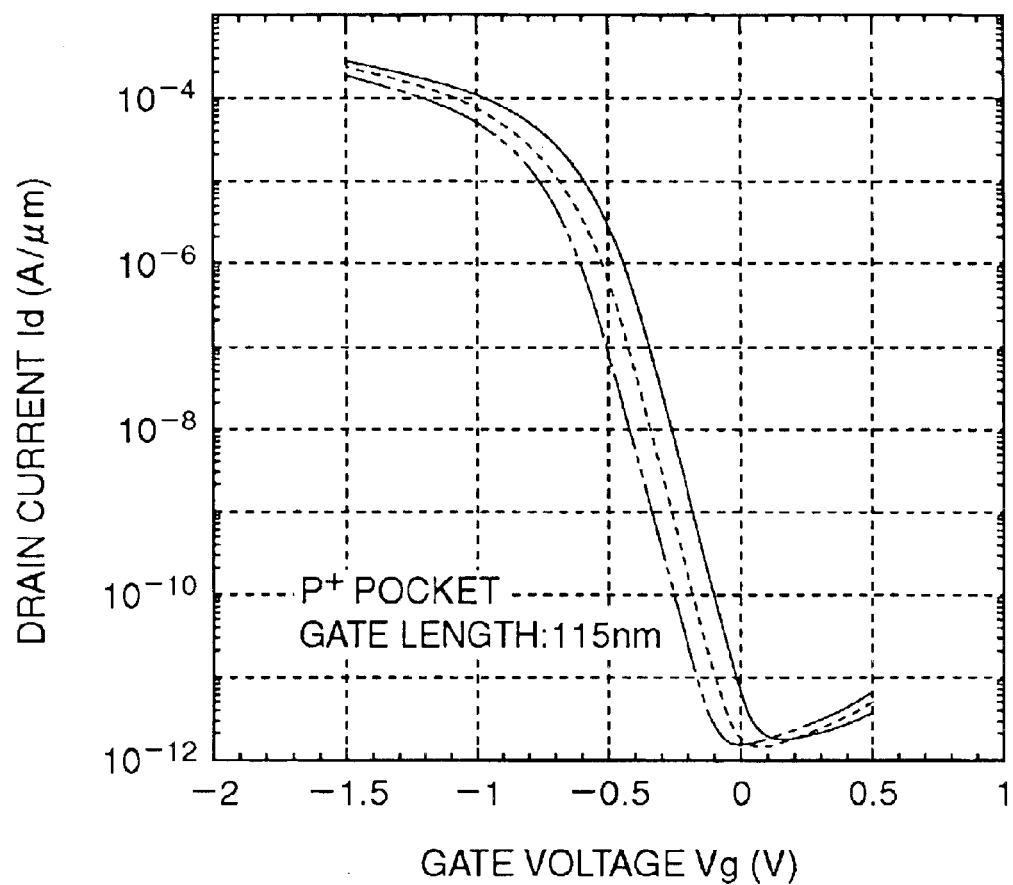
FIG. 17 is a graph showing relations of gate voltage $V_g$ and drain current $I_d$ of a PMOS transistor (gate length: 115 nm) having a P pocket layer.

For reference, FIG. 17 is a graph showing relations of gate voltage $V_g$ and drain current $I_d$ of the PMOS transistor having a P pocket layer and a gate length of 115 nm. As is known from comparison between FIGS. 13 and 17, the effect of reducing the BD leakage current as a consequence of reduction in the off-leakage current was obtained also when the gate length was 115 nm.

Figure 18:
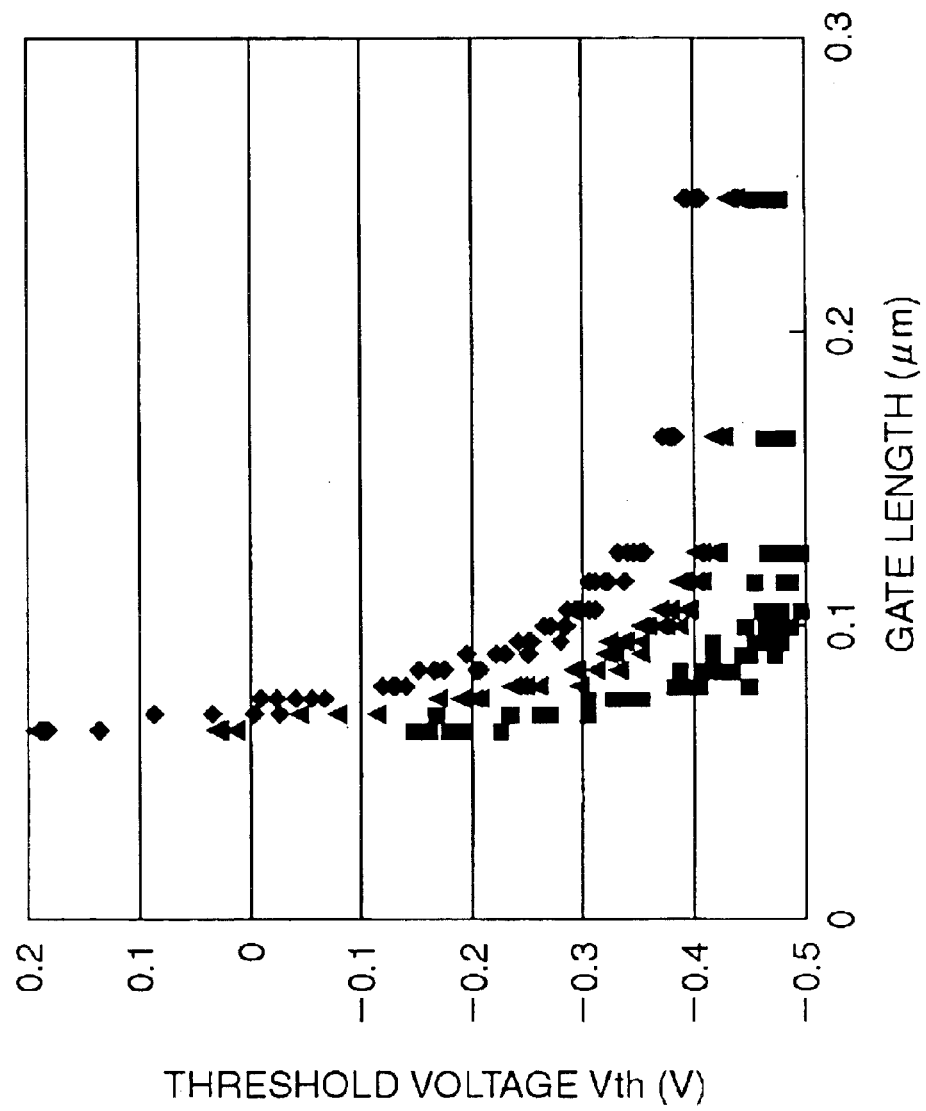
FIG. 18 is a graph showing relations of gate length and threshold voltage $V_{th}$ of a PMOS transistor having a P pocket layer.

Again for reference, FIG. 18 is a graph showing relations between gate length and threshold voltage $V_{th}$ of the PMOS transistor having the P pocket layer. Plots ▲, ● and ◆ in FIG. 18 respectively indicate results obtained under the same conditions used under the same symbols in FIG. 12. As is clear from FIG. 18, the roll-off was observed even when the P pocket layer was used if the gate length was as short as 80 nm or around. However even in this range of the gate length, the use of the P pocket layer made it possible to reduce the off-leakage current by raising the dose of the pocket layer, that is, channel impurity concentration as shown in FIG. 16.

Figure 19:
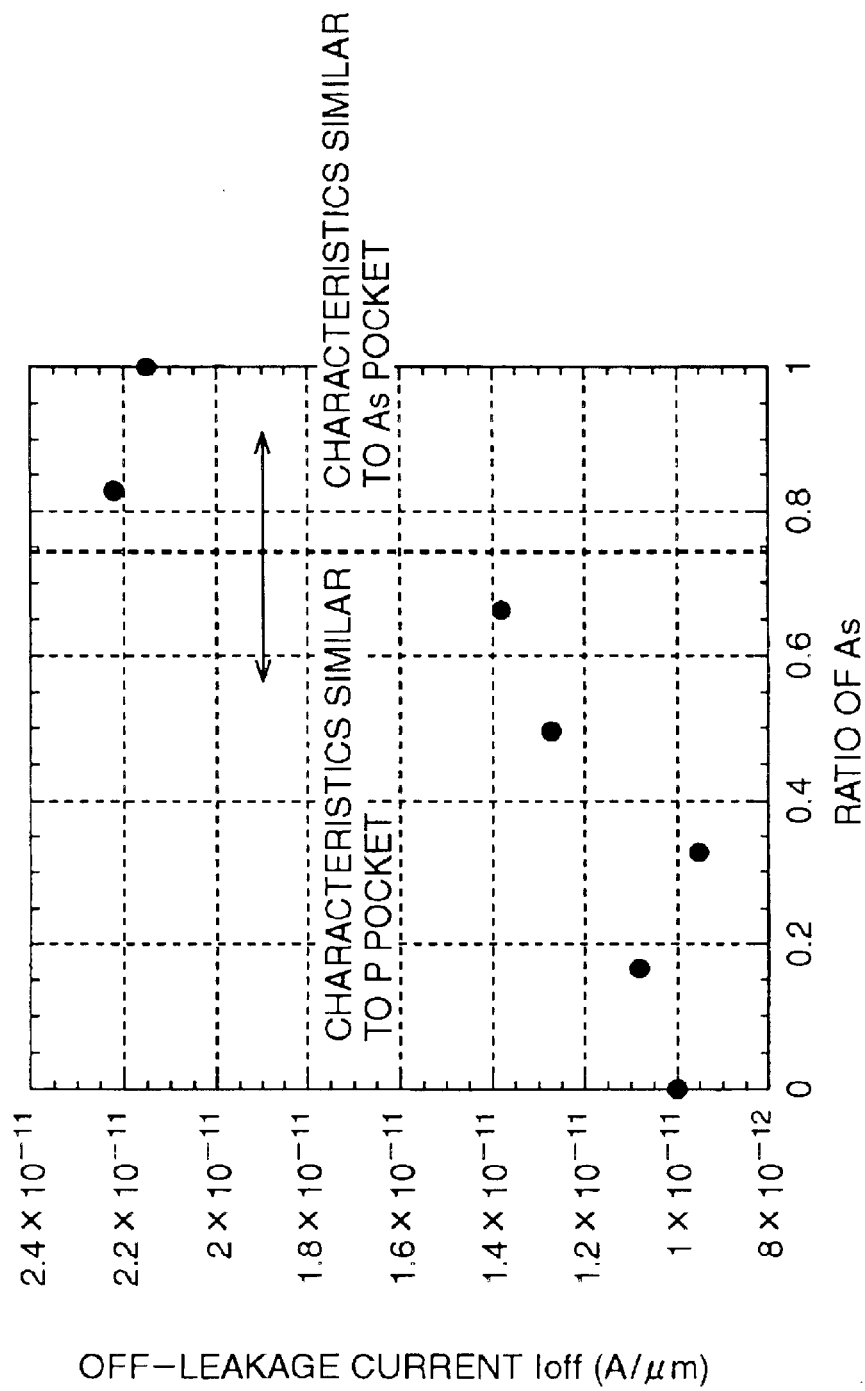
FIG. 19 is a graph showing relations between As ratio and off-leakage current.

It is to be noted that the N-type impurity in the pocket layer of the PMOS transistor is not always necessarily composed of P only, but may contain As together therewith. Studies by the present inventor on relations between As ratio and off-leakage current gave results shown in FIG. 19. The pocket was successful in showing a fully reduced off-leakage current similarly to as achieved by the P pocket, when the As ratio is less than 0.7 (70%) to the total N-type impurity in the pocket layer, or in other words, when the P ratio is 0.3 (30%) or more. Similar results were obtained also for the NMOS transistor, where the extension layer of the NMOS transistor is not always necessarily composed of P only, but may contain As together therewith. In this case, the P ratio of 0.5 (50%) or more was successful in fully reducing the off-leakage current similarly to as achieved by the P extension layer.

(First Embodiment)

Next paragraphs will describe a first embodiment of the present invention. It is to be noted that the configuration of the semiconductor device will be explained in combination with a method of fabrication therefor. The first embodiment relates to fabrication of a semiconductor device having an NMOS transistor. FIGS. 20A to 20G are sectional views sequentially showing process steps of a method of fabricating the semiconductor device according to the first embodiment of the present invention.

Figure 20A:
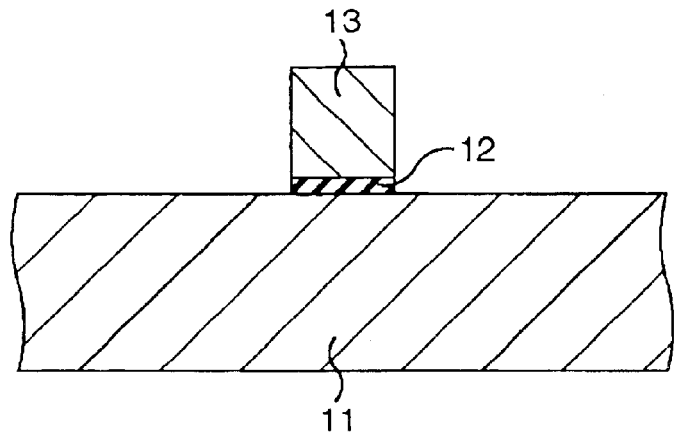
FIGS. 20A to 20G are sectional views sequentially showing process steps of a method of fabricating an NMOS transistor according to a first embodiment of the present invention.

In the first embodiment, first as shown in FIG. 20A, a gate insulating film 12 and a gate electrode 13 are formed on a semiconductor substrate 11 such as silicon substrate having a P-type well preliminarily formed in the surficial portion thereof. The length of the gate electrode 13 (gate length) is adjusted to 100 nm or shorter, for example.

Figure 20B:
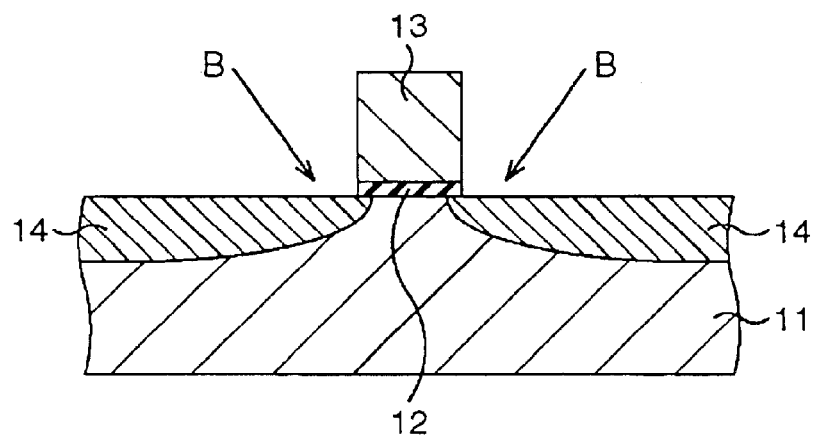

Next, as shown in FIG. 20B, a P-type impurity such as boron (B) is implanted to thereby form a pair of P-type pocket layers (P-type impurity-diffused layers) 14 in the surficial portion of the semiconductor substrate 11. The ions herein are implanted by oblique ion implantation which is effected from four directions normal to one another in a plan view, for example, at an implantation energy of 5 to 10 keV, and a dose per direction of $3 \times 10^{12}$ to $1.8 \times 10^{13}$ cm$^{-2}$.

Figure 20C:
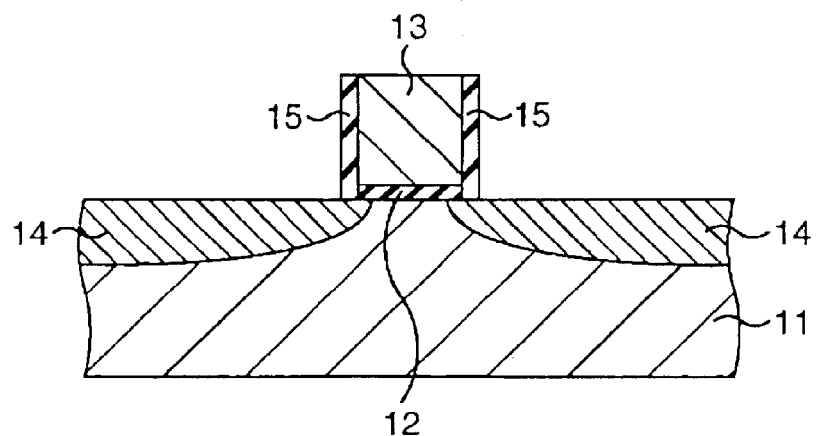

Next, as shown in FIG. 20C, a pair of thin sidewall insulating films (a first sidewall insulating films) 15 are formed on the lateral portions of the gate insulating film 12 and the gate electrode 13. The thickness of the thin sidewall insulating film 15 is, for example, adjusted to 10 nm or around. The thickness of the thin sidewall insulating film 15 less than 5 nm may undesirably lower the threshold voltage because the roll-off becomes actualized. On the other hand, the thickness of the thin sidewall insulating film 15 exceeding 15 nm may results in an elevation of the on-resistance due to an increased parasitic resistance. Therefore the thickness of the thin sidewall insulating film 15 preferably falls within a range from 5 to 15 nm or around. It should be noted that the pair of thin sidewall insulating films 15 may be formed before the P-type impurity is implanted to thereby form the pair of P-type pocket layers 14.

Figure 20D:
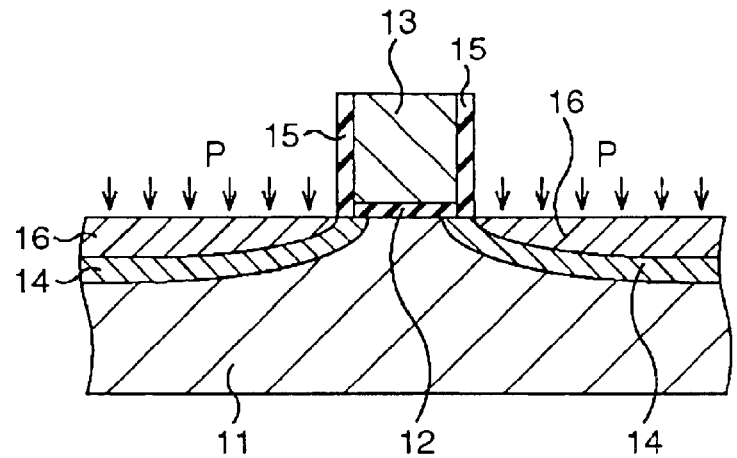

Thereafter as shown in FIG. 20D, phosphorus (P) ion is implanted to thereby form a pair of N-type extension layers (first N-type impurity-diffused layers) 16 in the surficial portion of the pocket layers 14. The ions herein are implanted by ion implantation which is effected from the direction normal to the surface of the semiconductor substrate 11. The implantation energy is set to 1 to 2.5 keV, and the dose to $5 \times 10^{14}$ to $2 \times 10^{15}$ cm$^{-2}$, for example.

Figure 20E:
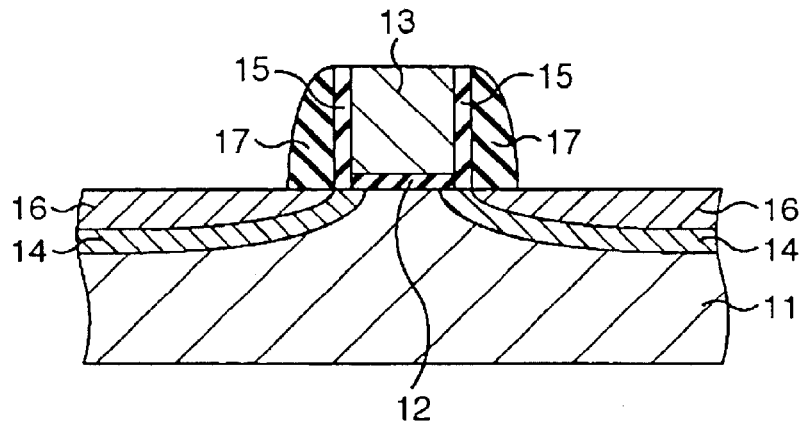

Next, an insulating film, a silicon oxide film, for example, is formed on the entire surface, and is then anisotropically etched so as to leave it only on the lateral portion of the thin sidewall insulating film 15, to thereby form a pair of sidewall insulating films (second sidewall insulating films) 17 as shown in FIG. 20E. The thickness of the sidewall insulating film 17 is, for example, adjusted to 75 nm or around. The thickness of the sidewall insulating film 17 is therefore wider than that of the sidewall insulating film 15.

Figure 20F:
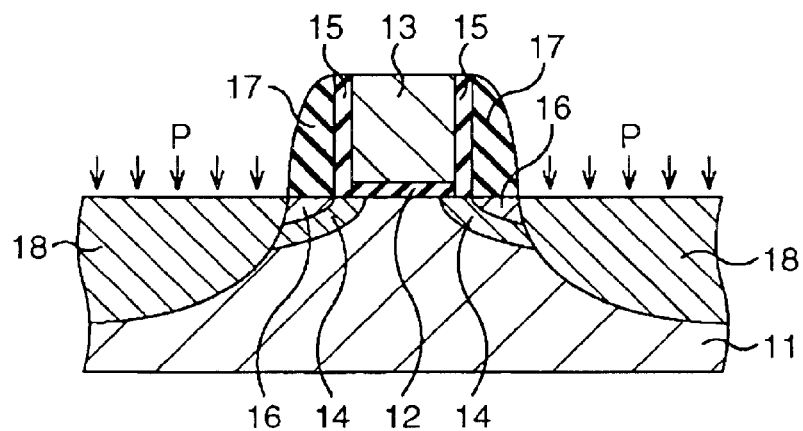

Thereafter, as shown in FIG. 20F, an N-type impurity ion, phosphorus ion, for example, is implanted at a high concentration to thereby form a pair of deep N-type source-and-drain diffusion layers (second N-type impurity-diffused layers) 18 in the surficial portion of the semiconductor substrate 11. The ion implantation herein is effected, for example, from the direction normal to the surface of the semiconductor substrate 11. The implantation energy is set to 4 to 10 keV, and the dose to $6 \times 10^{15}$ to $1.2 \times 10^{16}$ cm$^{-2}$, for example. The depth of the N-type source-and-drain diffused layer 18 is larger than that of the N-type extension layer 16. After the ion implantation, annealing is carried out so as to activate the implanted impurity.

Figure 20G:
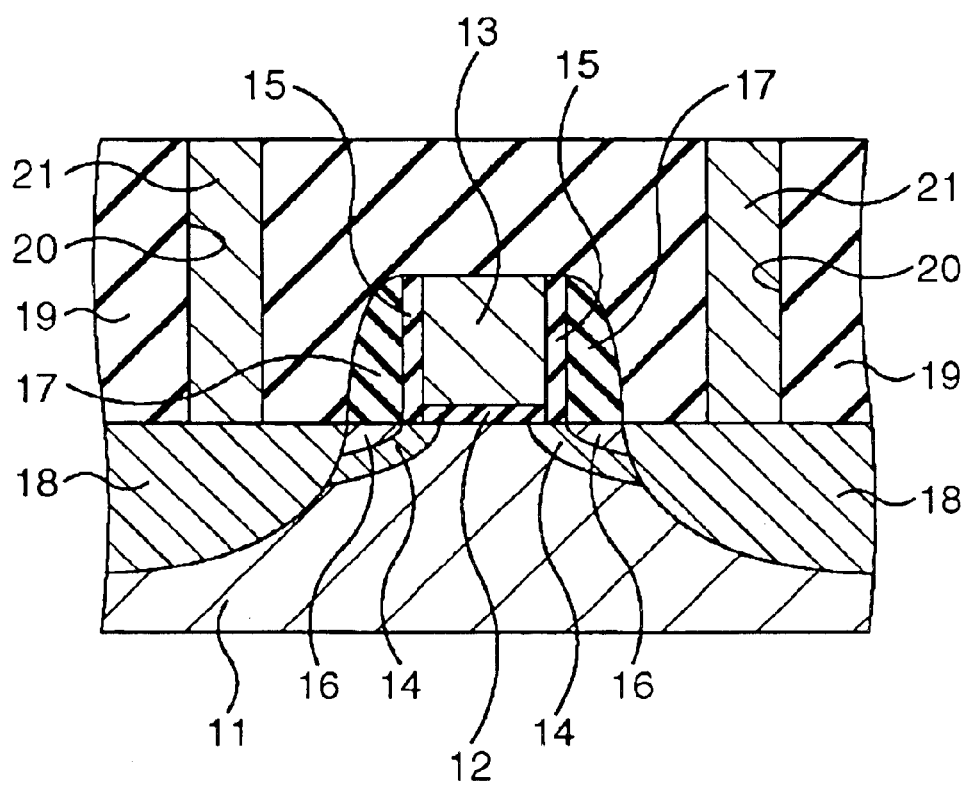

Thereafter, the semiconductor device is completed as shown in FIG. 20G by forming an interlayer insulating film 19, forming contact holes 20 so as to penetrate the interlayer insulating film 19 to reach the N-type source-and-drain diffusion layers 18, filling the contact holes 20 with a conductive material 21, forming wirings (not shown), and so on.

The thus-fabricated semiconductor device has a configuration shown in FIG. 20G.

According to the above-described first embodiment of the present invention, the N-type extension layer 16 is formed by ion implantation of phosphorus, which has a larger coefficient of diffusion than As has, while using the thin sidewall insulating film 15 as an off-set film, so that a strong electric field is prevented from generating in the vicinity of the channel even if the gate length is as short as 100 nm or less. This is successful in suppressing the BD leakage current, and consequently in suppressing the off-leakage current.

(Second Embodiment)

Next paragraphs will describe a second embodiment of the present invention. It is to be noted again that the configuration of the semiconductor device will be explained in combination with a method of fabrication therefor. The second embodiment relates to fabrication of a semiconductor device having a PMOS transistor. FIGS. 21A to 21F are sectional views sequentially showing process steps of a method of fabricating the semiconductor device according to the second embodiment of the present invention.

Figure 21A:
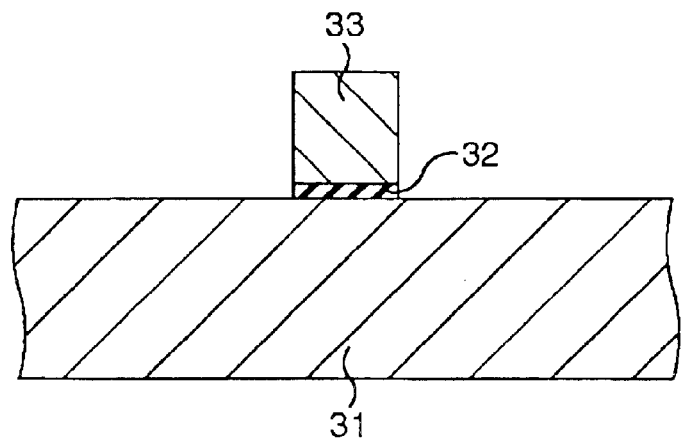
FIGS. 21A to 21F are sectional views sequentially showing process steps of a method of fabricating a PMOS transistor according to the second embodiment of the present invention.

In the second embodiment, first as shown in FIG. 21A, a gate insulating film 32 and a gate electrode 33 are formed on a semiconductor substrate 31 such as silicon substrate having an N-type well preliminarily formed in the surficial portion thereof. The length of the gate electrode 33 (gate length) is adjusted to 100 nm or shorter, for example.

Figure 21B:
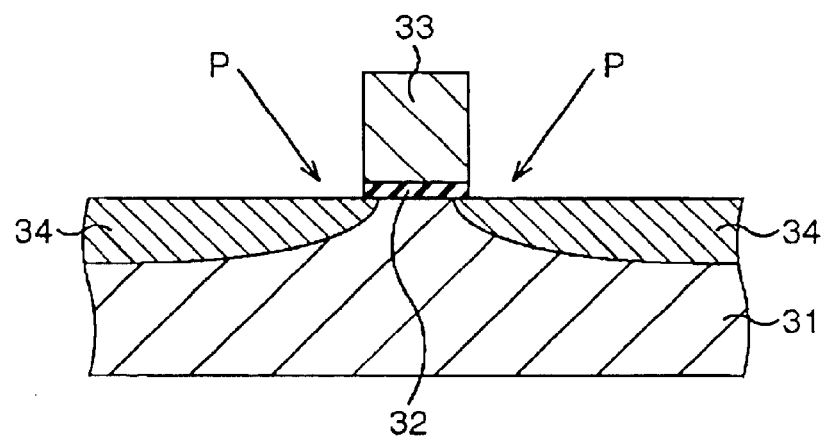

Next, as shown in FIG. 21B, phosphorus is implanted to thereby form a pair of N-type pocket layers (N-type impurity-diffused layers) 34 in the surficial portion of the semiconductor substrate 31. The ions herein are implanted by oblique ion implantation which is effected from four directions normal to one another in a plan view, at an implantation energy of 15 to 30 keV, and a dose per direction of $3 \times 10^{12}$ to $1.5 \times 10^{13}$ cm$^{-2}$, for example.

Figure 21C:
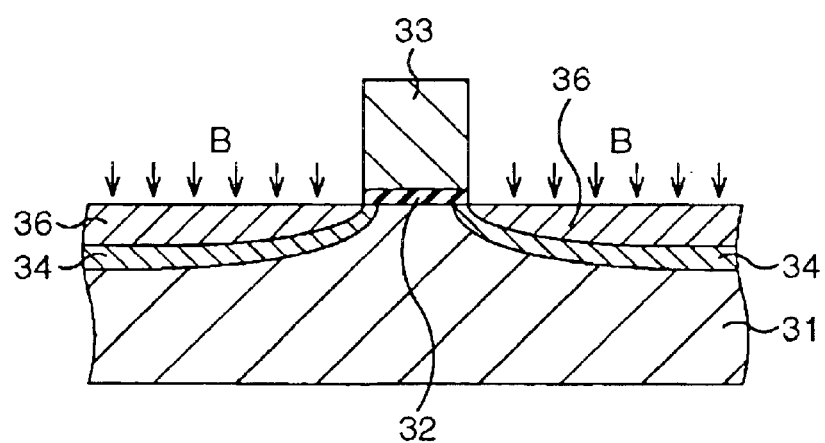

Next as shown in FIG. 21C, a P-type impurity ion, boron (B) ion, for example, is implanted to thereby form a pair of P-type extension layers (first P-type impurity-diffused layers) 36 in the surficial portion of the pocket layers 34. The ion implantation herein is effected, for example, from the direction normal to the surface of the semiconductor substrate 31. The implantation energy is set to 0.2 to 0.5 keV, and the dose to $5 \times 10^{14}$ to $2 \times 10^{15}$ cm$^{-2}$.

Figure 21D:
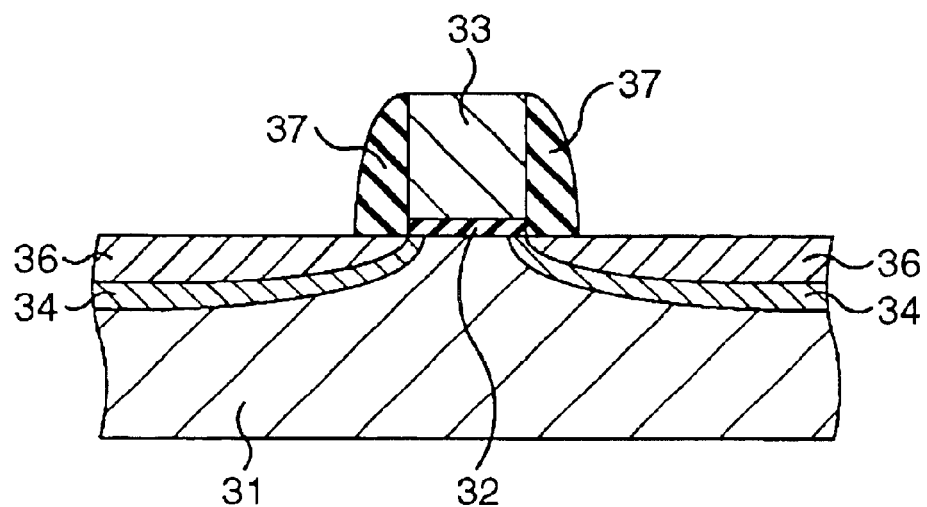

Next, an insulating film, a silicon oxide film, for example, is formed on the entire surface, and is then anisotropically etched so as to leave it only on the lateral portions of the gate insulating film 32 and the gate electrode 33, to thereby form a pair of sidewall insulating films 37 as shown in FIG. 21D. The thickness of the sidewall insulating film 37 is adjusted to 75 nm or around, for example.

Figure 21E:
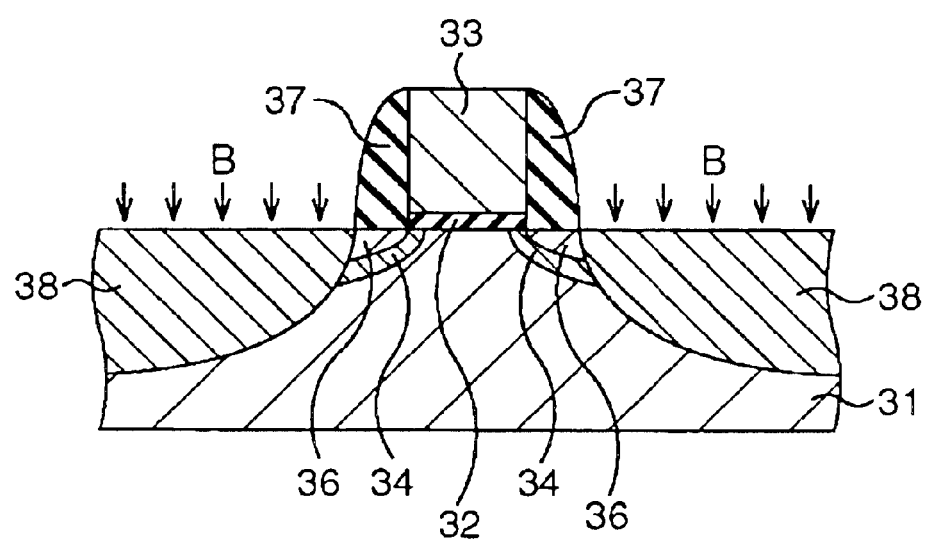

Thereafter, as shown in FIG. 21E, a P-type impurity ion, boron ion, for example, is implanted at a high concentration to thereby form a pair of deep P-type source-and-drain diffusion layers (second P-type impurity-diffused layers) 38 in the surficial portion of the semiconductor substrate 31. The ion implantation herein is effected, for example, from the direction normal to the surface of the semiconductor substrate 31. The implantation energy is set to 3 to 6 keV, and the dose to $4 \times 10^{15}$ to $6 \times 10^{15}$ cm$^{-2}$, for example. The depth of the P-type source-and-drain diffused layer 38 is larger than that of the P-type extension layer 36. After the ion implantation, annealing is carried out so as to activate the implanted impurity.

Figure 21F:
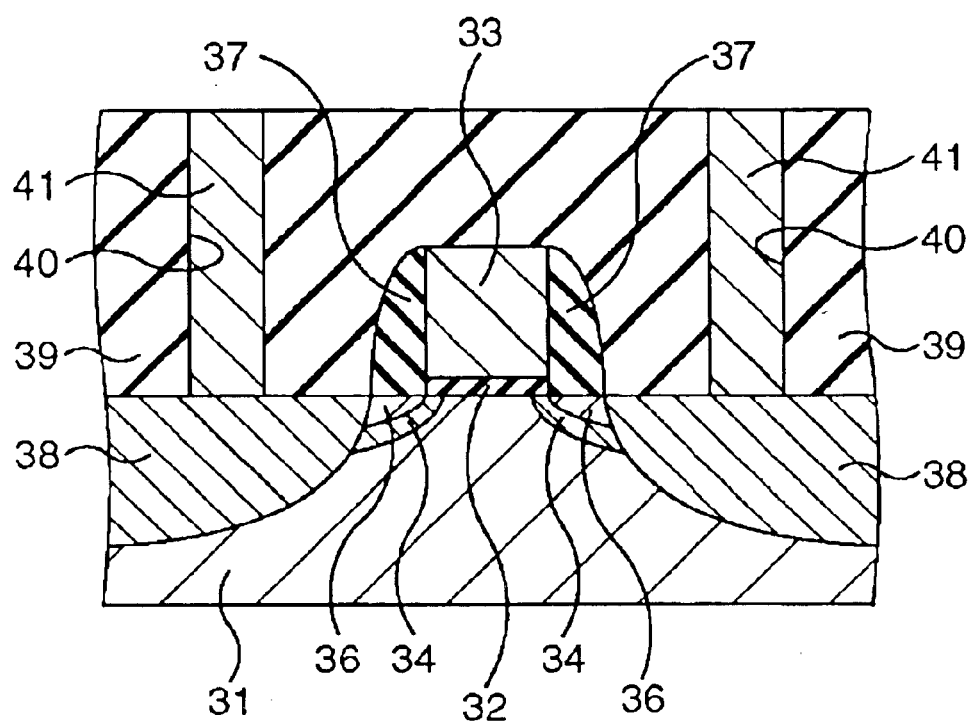
Figure 22A:
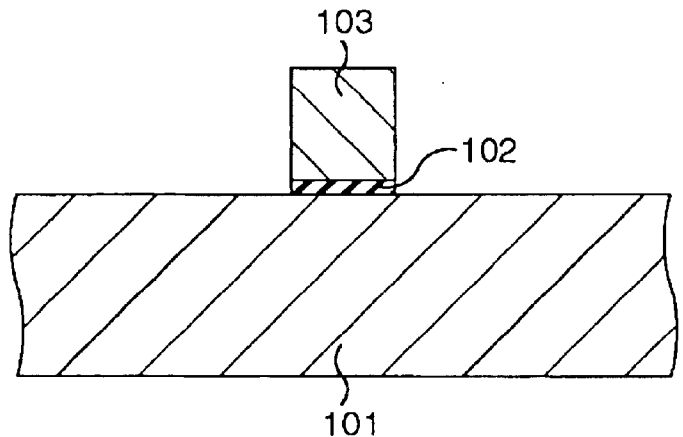
FIGS. 22A to 22C are sectional views sequentially showing process steps of a conventional method of fabricating an NMOS transistor.
Figure 22B:
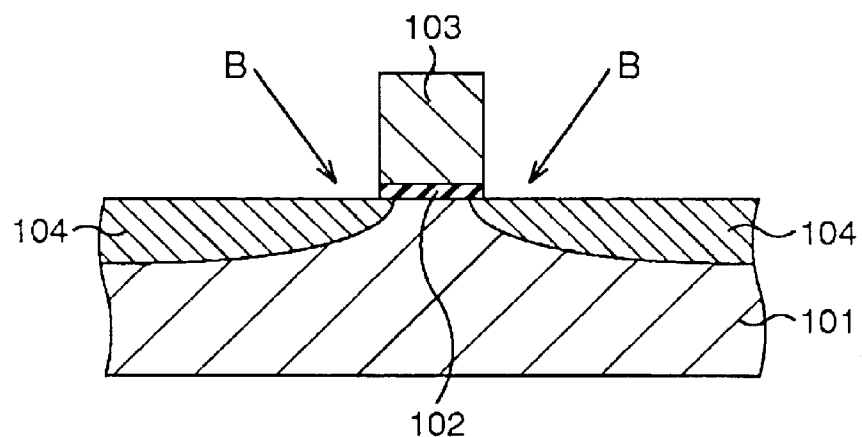
Figure 22C:
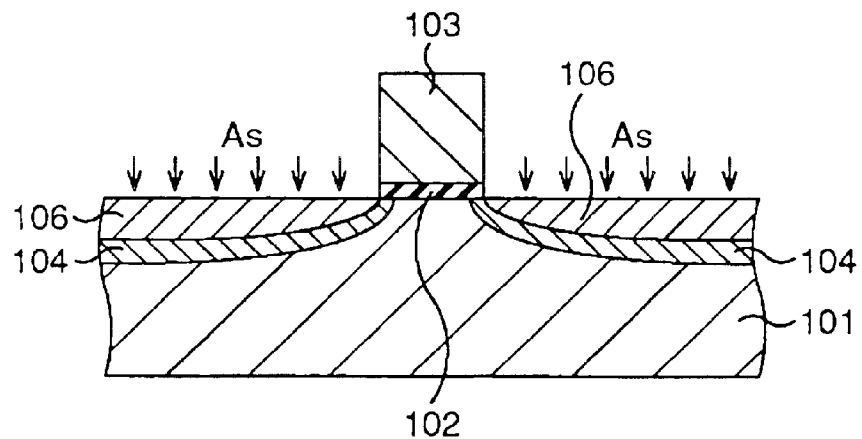
Figure 23A:
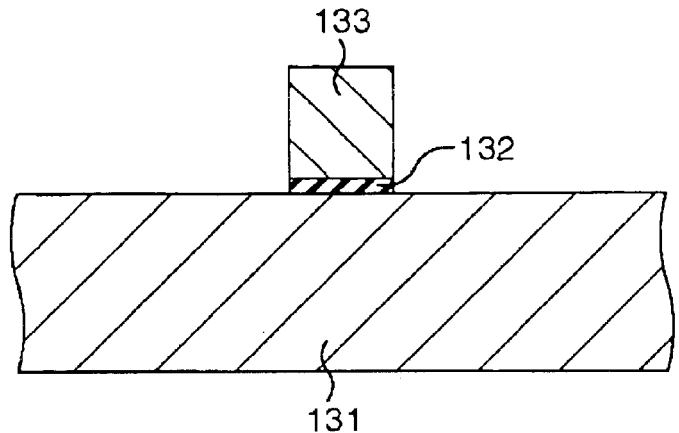
FIGS. 23A to 23C are sectional views sequentially showing process steps of a conventional method of fabricating a PMOS transistor.
Figure 23B:
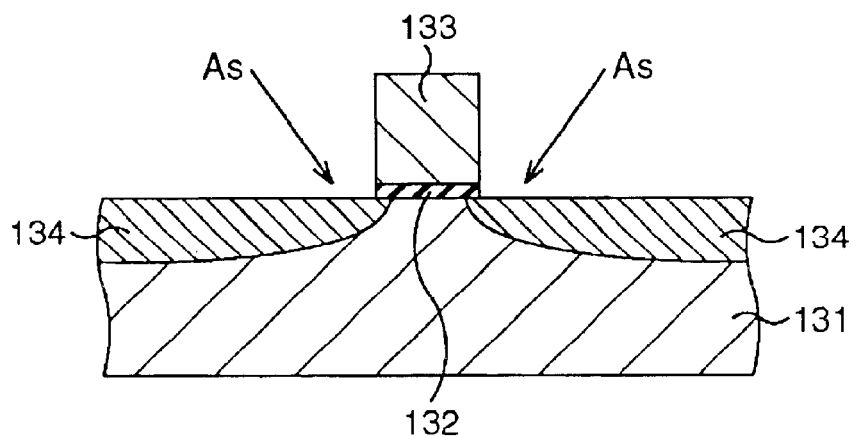
Figure 23C:
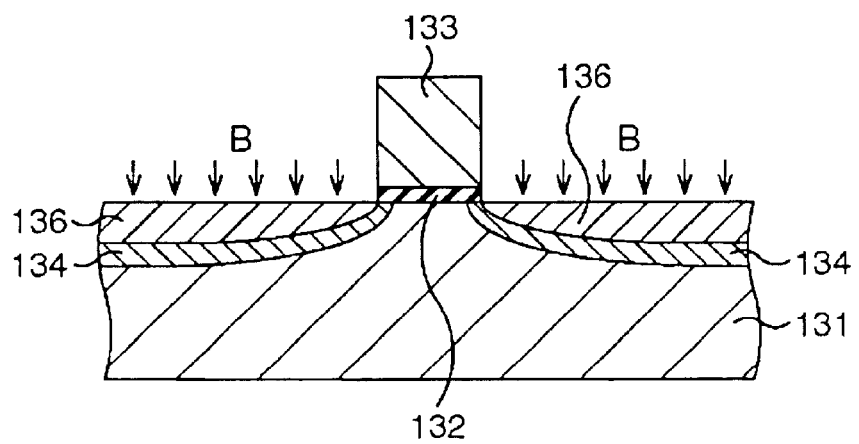

Thereafter, the semiconductor device is completed as shown in FIG. 21F by forming an interlayer insulating film 39, forming contact holes 40 so as to penetrate the interlayer insulating film 39 to reach the P-type source-and-drain diffusion layers 38, filling the contact-holes 40 with a conductive material 41, forming wirings (not shown), and so on.

The thus-fabricated semiconductor device has a configuration shown in FIG. 21F.

According to the second embodiment of the present invention, the P-type pocket layer 34 is formed by ion implantation of phosphorus, so that a strong electric field is prevented from generating in the vicinity of the channel even if the gate length is as short as 100 nm or less. This is successful in suppressing the BD leakage current, and consequently in suppressing the off-leakage current, similarly to as in the first embodiment.

What is claimed is:

1. A semiconductor device comprising:
    a semiconductor substrate;
    a gate insulating film and a gate electrode formed on said semiconductor substrate;
    a pair of first sidewall insulating films formed on the lateral portions of said gate electrode;
    a pair of second sidewall insulating films formed so as to sandwich said first sidewall insulating films with said gate electrode, and having a width larger than that of said first sidewall insulating films;
    a pair of first N-type impurity-diffused layers containing phosphorus formed in the surficial portion of said semiconductor substrate at a first depth so as to be self-aligned with respect to said gate electrode and said first sidewall insulating films;
    a pair of second N-type impurity-diffused layers formed in the surficial portion of said semiconductor substrate at a second depth deeper than said first depth so as to be self-aligned with respect to said gate electrode, said first sidewall insulating films and said second sidewall insulating films; and
    a pair of P-type impurity-diffused layers formed between said pair of second N-type impurity-diffused layers, and respectively in adjacent to each of said pair of first N-type impurity-diffused layers.

2. The semiconductor device according to claim 1, wherein said first sidewall insulating films have a thickness of 5 to 15 nm.

3. The semiconductor device according to claim 1, wherein said first N-type impurity-diffused layers contain arsenic.

4. The semiconductor device according to claim 1, wherein phosphorus accounts for 50 atomic percent or more of N-type impurities introduced into said first N-type impurity-diffused layers.

5. A semiconductor device comprising:
    a semiconductor substrate;
    a gate insulating film and a gate electrode formed on said semiconductor substrate;
    a pair of sidewall insulating films formed on the lateral portions of said gate electrode;
    a pair of first P-type impurity-diffused layers formed in the surficial portion of said semiconductor substrate at a first depth so as to be self-aligned with respect to said gate electrode;
    a pair of second P-type impurity-diffused layers formed in the surficial portion of said semiconductor substrate at a second depth deeper than said first depth so as to be self-aligned with respect to said gate electrode and said sidewall insulating films; and
    a pair of N-type impurity-diffused layers containing phosphorus formed between said pair of second P-type impurity-diffused layers, and respectively in adjacent to each of said pair of first P-type impurity-diffused layers.

6. The semiconductor device according to claim 5, wherein said N-type impurity-diffused layers contain arsenic.

7. The semiconductor device according to claim 5, wherein phosphorus accounts for 30 atomic percent or more of N-type impurities introduced into said N-type impurity-diffused layers.

8. The semiconductor device according to claim 1, wherein the length of said gate electrode is not longer than 100 nm.

9. The semiconductor device according to claim 5, wherein the length of said gate electrode is not longer than 100 nm.

10. A method of fabricating a semiconductor device comprising the steps of:
    forming a gate insulating film and a gate electrode on a semiconductor substrate;
    forming a pair of P-type impurity-diffused layers by introducing a P-type impurity into the surficial portion of said semiconductor substrate with using said gate electrode as a mask;
    forming a pair of first sidewall insulating films on the lateral portions of said gate electrode;
    forming a pair of first N-type impurity-diffused layers at a first depth by introducing at least phosphorus into the surficial portion of said semiconductor substrate with using said gate electrode and said first sidewall insulating films as a mask;
    forming a pair of second sidewall insulating films so as to sandwich the said first sidewall insulating films with said gate electrode, and so as to have a width larger than that of said first sidewall insulating films; and
    forming a pair of second N-type impurity-diffused layers at a second depth deeper than said first depth by introducing an N-type impurity into the surficial portion of said semiconductor substrate with using said gate electrode, said first sidewall insulating films and said second sidewall insulating films as a mask.

11. The method of fabricating a semiconductor device according to claim 10, wherein said first sidewall insulating films are formed to a thickness of 5 to 15 nm.

12. The method of fabricating a semiconductor device according to claim 10, wherein in said step of forming a pair of first N-type impurity-diffused layers, arsenic is introduced together with phosphorus into the surficial portion of said semiconductor substrate.

13. The method of fabricating a semiconductor device according to claim 10, wherein said first N-type impurity-diffused layers are adjusted so that phosphorus accounts for 50 atomic percent or more of the N-type impurities introduced therein.

14. A method of fabricating a semiconductor device comprising the steps of:
    forming a gate insulating film and a gate electrode on a semiconductor substrate;

forming a pair of N-type impurity-diffused layers by introducing at least phosphorus into the surficial portion of said semiconductor substrate with using said gate electrode as a mask;

forming a pair of first P-type impurity-diffused layers at a first depth by introducing a P-type impurity into the surficial portion of said semiconductor substrate with using said gate electrode as a mask;

forming a pair of sidewall insulating films on the lateral portions of said gate electrode; and forming a pair of second P-type impurity-diffused layers at a second depth deeper than said first depth by introducing a P-type impurity into the surficial portion of said semiconductor substrate with using said gate electrode and said sidewall insulating films as a mask.

15. The method of fabricating a semiconductor device according to claim 14, wherein in said step of forming a pair of N-type impurity-diffused layers, arsenic is introduced together with phosphorus into the surficial portion of said semiconductor substrate.

16. The method of fabricating a semiconductor device according to claim 14, wherein said N-type impurity-diffused layers are adjusted so that phosphorus accounts for 30 atomic percent or more of the N-type impurities introduced therein.

17. The method of fabricating a semiconductor device according to claim 10, wherein in said step of forming a gate electrode, said gate electrode is formed to a length of not longer than 100 nm.

18. The method of fabricating a semiconductor device according to claim 14, wherein in said step of forming a gate electrode, said gate electrode is formed to a length of not longer than 100 nm.

* * * * *